United States Patent
Dave et al.

(10) Patent No.: US 8,930,789 B1
(45) Date of Patent: Jan. 6, 2015

(54) HIGH-SPEED LDPC DECODER

(71) Applicant: ViaSat, Inc., Carlsbad, CA (US)

(72) Inventors: Sameep Dave, Hinckley, OH (US); Fan Mo, Hinckley, OH (US)

(73) Assignee: ViaSat, Inc., Carlsbad, CA (US)

( * ) Notice: Subject to any disclaimer, the term of this patent is extended or adjusted under 35 U.S.C. 154(b) by 120 days.

(21) Appl. No.: 13/835,177

(22) Filed: Mar. 15, 2013

Related U.S. Application Data

(60) Provisional application No. 61/755,904, filed on Jan. 23, 2013.

(51) Int. Cl.
H03M 13/00 (2006.01)
H03M 13/13 (2006.01)
H03M 13/11 (2006.01)

(52) U.S. Cl.
CPC .......... *H03M 13/13* (2013.01); *H03M 13/1134* (2013.01)
USPC .......................................................... 714/752

(58) Field of Classification Search
CPC ................................................ H03M 13/1134
See application file for complete search history.

(56) References Cited

U.S. PATENT DOCUMENTS

| | | | | |
|---|---|---|---|---|
| 6,633,856 B2* | 10/2003 | Richardson et al. | ............ | 706/15 |
| 6,829,308 B2* | 12/2004 | Eroz et al. | ...................... | 375/271 |
| 7,127,659 B2* | 10/2006 | Richardson et al. | .......... | 714/758 |
| 7,281,192 B2* | 10/2007 | Shen et al. | ...................... | 714/757 |
| 7,296,208 B2* | 11/2007 | Sun et al. | ....................... | 714/752 |
| 7,395,487 B2* | 7/2008 | Tran et al. | ...................... | 714/758 |
| 7,500,172 B2* | 3/2009 | Shen et al. | ..................... | 714/780 |
| 7,587,659 B2* | 9/2009 | Tran et al. | ...................... | 714/794 |
| 7,760,880 B2* | 7/2010 | Dave et al. | ..................... | 380/240 |
| 7,770,090 B1* | 8/2010 | Kons et al. | ..................... | 714/780 |
| 8,261,166 B2* | 9/2012 | Ulriksson | ..................... | 714/786 |
| 8,566,668 B1 | 10/2013 | Dave et al. | | |
| 2003/0023917 A1* | 1/2003 | Richardson et al. | .......... | 714/749 |
| 2003/0033575 A1* | 2/2003 | Richardson et al. | .......... | 714/799 |
| 2005/0005231 A1 | 1/2005 | Sun et al. | | |
| 2005/0204271 A1 | 9/2005 | Sharon et al. | | |
| 2006/0107181 A1 | 5/2006 | Dave et al. | | |
| 2008/0104474 A1 | 5/2008 | Gao et al. | | |

OTHER PUBLICATIONS

Shuang Wang; Cheng, S.; Qiang Wu, "A parallel decoding algorithm of LDPC codes using CUDA," Signals, Systems and Computers, 2008 42nd Asilomar Conference on , vol., no., pp. 171,175, Oct. 26-29, 2008.*

(Continued)

*Primary Examiner* — Steve Nguyen
(74) *Attorney, Agent, or Firm* — Holland & Hart LLP

(57) ABSTRACT

Methods, systems, and devices are described for decoding data using a low-density parity check (LDPC) decoder. An edge memory in the LDPC decoder is configured to have a first bank and a second bank of memory partitions. The first bank stores extrinsic information for edges for a first set of N check nodes and the second bank stores extrinsic information for edges for a second set of N check nodes. The first and second banks are concurrently accessed to process 2N check nodes in parallel. The first and second sets of N check nodes may respectively correspond to odd-numbered and even-numbered check nodes from the 2N check nodes processed in parallel by the LDPC decoder. The LDPC decoder operation may include initializing channel soft information into a memory different from the edge memory and the use of incremental changes in the extrinsic information to update the extrinsic information.

16 Claims, 17 Drawing Sheets

(56) References Cited

OTHER PUBLICATIONS

Sankar et al., Memory-efficient Sum-product Decoding of LDPC Codes, Transaction Letters, IEEE Transactions on Communications, vol. 52, No. 8, pp. 1225-1230, Aug. 2004.
Non-Final Office Action dated Jan. 4, 2013, LDPC Decoder Architecture, U.S. Appl. No. 12/984,428, 11 pgs.
Non-Final Office Action dated Mar. 14, 2013, LDPC Decoder Architecture, U.S. Appl. No. 12/984,428, 9 pgs.
Final Office Action dated Jul. 10, 2013, LDPC Decoder Architecture, U.S. Appl. No. 12/984,428, 7 pgs.
Notice of Allowance and Examiner's Amendment dated Aug. 26, 2013, LDPC Decoder Architecture, U.S. Appl. No. 12/984,428, 8 pgs.
Notice of Allowance dated May 5, 2014, LDPC Decoder Architecture, U.S. Appl. No. 12/984,428, 6 pgs.
Non-Final Office Action dated Dec. 5, 2012, Edge Memory Architecture for LDPC Decoder, U.S. Appl. No. 12/984,013, 16 pgs.
Notice of Allowance dated Jun. 3, 2013, Edge Memory Architecture for LDPC Decoder, U.S. Appl. No. 12/984,013, 6 pgs.
Corrected Notice of Allowance dated Sep. 25, 2013, Edge Memory Architecture for LDPC Decoder, U.S. Appl. No. 12/984,013, 6 pgs.

\* cited by examiner

HIGH-SPEED LDPC DECODER

CROSS REFERENCES

This application for patent claims priority benefit of U.S. provisional patent application Ser. No. 61/755,904 to Dave et al., entitled "High-Speed LDPC Decoder," filed Jan. 23, 2013, the disclosure of which is incorporated herein in its entirety for all purposes.

BACKGROUND

The present disclosure relates to systems and methods digital modulation and demodulation of data in a fiber optic communications system.

Fiber optic channels in network communications systems are well known and are considered effective for data transmission, allowing relatively high bandwidth data communication. Optical fiber used in such channels is flexible and can be bundled as cables, and is generally considered to be appropriate for long-distance communications because light propagates through the fiber with little attenuation compared to electrical cables. Typical present day commercial optical fiber systems transmit data at 10 or 40 Gigabit-per-second. Each fiber can carry multiple independent channels, each using a different wavelength of light in a technique known as wavelength-division multiplexing or WDM, thereby enhancing the net data rate of an optical fiber.

As more capacity is continually desired for networks, a demand for increased data transmission rates exists. However, in fiber optic systems, as data rates increase various optical phenomena begin to manifest and act to limit data transmission rates. For example, chromatic dispersion and polarization mode may affect the ability of a receiver to demodulate and decode a transmitted optical signal. Forward error corrections (FEC) schemes are often used to send redundant data to address these issues, as well as others.

Low-density parity check (LDPC) codes have been used as an effective FEC scheme in different areas of communications. The use of LDPC codes in high speed optical communications, however, may present some challenges because of the latency associated with the iterative decoding process.

SUMMARY

Methods, systems, and devices are described for decoding data using a low-density parity check (LDPC) decoder.

In a first set of embodiments, a device for decoding data using an LDPC decoder, where the LDPC decoder uses a code structure that supports N check nodes processed in parallel, includes an edge memory, a first processing module, and a second processing module. The edge memory is configured to have a first bank of memory partitions to store extrinsic information for edges corresponding to a first set of N check nodes and a second bank of memory partitions to store extrinsic information for edges corresponding to a second set of N check nodes, the first and second banks of the edge memory being independent from each other. The first processing module is configured to process the first set of N check nodes. The second processing module is configured to process the second set of N check nodes, the first and second sets of N check nodes being processed in parallel by concurrently accessing extrinsic information from the first and second banks of the edge memory in connection with the first and second sets of N check nodes, respectively.

In a second set of embodiments, a method for decoding data using an edge memory in an LDPC decoder, where the LDPC decoder uses a code structure that supports N check nodes processed in parallel, includes storing, in a first bank of memory partitions of the edge memory, extrinsic information for edges corresponding to a first set of N check nodes. The method also includes storing, in a second bank of memory partitions of the edge memory, extrinsic information for edges corresponding to a second set of N check nodes, the first and second banks of the edge memory being independent from each other. The method further includes processing, in the LDPC decoder, 2N check nodes in parallel by concurrently accessing extrinsic information from the first and second banks of the edge memory in connection with the first and second sets of N check nodes, respectively.

In a third set of embodiments, a system for decoding data using an edge memory in an LDPC decoder, where the LDPC decoder uses a code structure that supports N check nodes processed in parallel, includes means for storing, in a first bank of memory partitions of the edge memory, extrinsic information for edges corresponding to a first set of N check nodes. The system also includes means for storing, in a second bank of memory partitions of the edge memory, extrinsic information for edges corresponding to a second set of N check nodes, the first and second banks of the edge memory being independent from each other. The system further includes means for processing, in the LDPC decoder, 2N check nodes in parallel by concurrently accessing extrinsic information from the first and second banks of the edge memory in connection with the first and second sets of N check nodes, respectively.

BRIEF DESCRIPTION OF THE DRAWINGS

A further understanding of the nature and advantages of embodiments of the present disclosure may be realized by reference to the following drawings. In the appended figures, similar components or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Methods, systems, and devices are described for decoding data using a low-density parity check (LDPC) decoder. The LDPC decoder is based at least in part on a code structure that supports a number (N) of check nodes processed in parallel. An edge memory in the LDPC decoder is configured to have a first bank of memory partitions and a second bank of memory partitions. The first bank stores extrinsic information for edges corresponding to a first set of N check nodes and the second bank stores extrinsic information for edges for a second set of N check nodes. The first bank and the second bank are concurrently accessed to process 2N check nodes in parallel. The edge memory may be a random access memory (RAM) with two sets of read/write ports that allow for each of the banks to be accessed independently. The first set of N check nodes may correspond to the odd-numbered check nodes from the 2N check nodes processed by the LDPC decoder, while the second set of N check nodes may correspond to the even-numbered check nodes from the 2N check nodes processed by the LDPC decoder. The LDPC decoder operation may be simplified by initializing channel soft information into a memory in the LDPC decoder different from the edge memory and by using incremental changes in the extrinsic information to update the extrinsic information.

This description provides examples, and is not intended to limit the scope, applicability or configuration of embodiments of the principles described herein. Rather, the ensuing description will provide those skilled in the art with an enabling description for implementing embodiments of the principles described herein. Various changes may be made in the function and arrangement of elements.

Thus, various embodiments may omit, substitute, or add various procedures or components as appropriate. For instance, it should be appreciated that the methods may be performed in an order different than that described, and that various steps may be added, omitted or combined. Also, aspects and elements described with respect to certain embodiments may be combined in various other embodiments. It should also be appreciated that the following systems, methods, devices, and software may individually or collectively be components of a larger system, wherein other procedures may take precedence over or otherwise modify their application.

Figure 1:
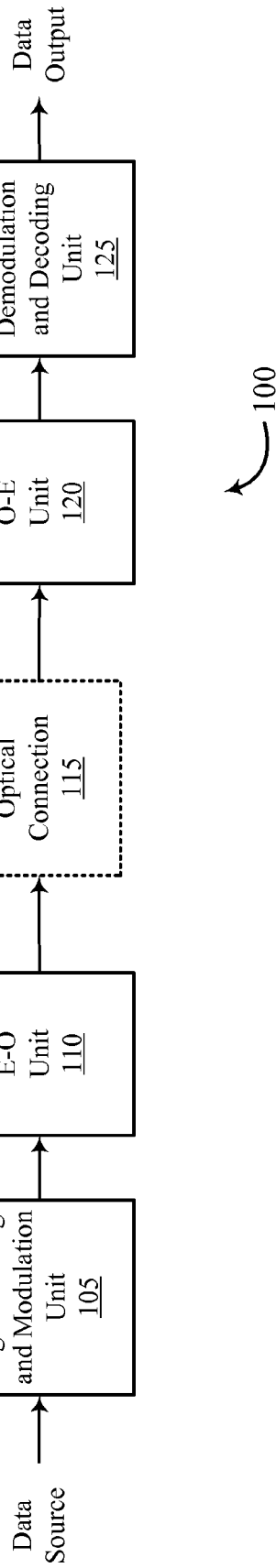
FIG. 1 is a block diagram of an example of an optical communication system including components configured according to various embodiments of the principles described herein.

Systems, devices, methods, and software are described for an optical communication system that uses fiber optic cables as a data transmission medium or path. An example of an optical data transport system 100 is illustrated in FIG. 1. In the present example, the optical data transport system 100 includes a digital coding and modulation unit 105, an electrical-to-optical (E-O) unit 110, an optical connection 115, an optical-to-electrical (O-E) unit 120, and a digital demodulation and decoding unit 125. Each of these components may be in communication, directly or indirectly.

In one embodiment, the optical data transport system 100 includes a data source that provides data to a digital coding and modulation unit 105. The data source may include any of a number of common data sources, such as a user telecommunications device, a cable operator head-end unit, a telecommunications provider central office, a computer server, or a network attached storage system, to name but a few examples. In many embodiments, the data source generates significant quantities of data to be transported across the optical data transport system 100. In some instances, the transmission data rate across the optical data transport system 100 may be 40 Gbps or higher. For example, the transmission data rate may be 100 Gbps or as high as 200 Gbps.

The digital coding and modulation unit 105 receives this data, and performs framing, forward error correction (FEC) coding, and modulation functions on the data. The FEC coding may be carried out using an LDPC encoder. The electrical-to-optical (E-O) unit 110 transforms the data into optical signals, and transmits optical signals containing the data via an optical connection 115. The optical signal produced by the E-O unit 110 may be transmitted to the optical connection 115 by using one or more lasers (not shown), one or more optical components (not shown), and/or one or more electro-optic devices (not shown). The optical connection 115 may include well known components of such connections, including a fiber optic cable. In some embodiments, the optical connection 115 may include any type of medium or path that enables optical signals, or like signals, to propagate. The optical connection 115 may introduce several optical phenomena that may cause phase and/or amplitude distortion.

An optical-to-electrical (O-E) unit 120 receives the optical signal from the optical connection 115, and transforms the data into the electrical domain. The optical signal received by the E-O unit 120 may be received from the optical connection 115 by using one or more lasers (not shown), one or more optical components (not shown), and/or one or more electro-optic devices (not shown). When the optical data is coherently received, phase information included in the optical signal is preserved after the O-E unit 120 transforms the data in the optical signal to the electrical domain.

The digital demodulation and decoding unit 125 receives the digitized version of the optical signal and performs demodulation, FEC decoding, and de-framing functions on the data from the optical signal. When data is interleaved for transmission, the digital demodulation and decoding unit 125 may de-interleave the received data. The digital demodulation and decoding unit 125 may then output the data (e.g., to a user telecommunications device, a cable operator head-end unit, a telecommunications provider central office, a computer server, or a network attached storage system).

During FEC decoding, the digital demodulation and decoding unit 125 may use an LDPC decoder (not shown) that has an associated edge memory (e.g., RAM). The LDPC decoder may be based at least in part on a code structure that supports a number of operations to take place in parallel. For example, in Digital Video Broadcasting-Satellite-Second Generation (DVB-S2), the number parallel operations is typically 360. The edge memory may be configured to have a first bank of memory partitions and a second bank of memory partitions that allow the LDPC decoder to perform twice the number of check node operations without having to double the size of the edge memory. In the case of DVB-S2, for example, the LDPC decoder may be able to perform 720 operations in parallel without having to double the size of the edge memory. Increasing the size of the edge memory may be difficult to do because of limited RAM available in Field Programmable Gate Arrays (FPGAs) or because of layout rules in an Application Specific Integrated Circuit (ASIC). The edge memory may have two sets of read/write ports that allow for each of the banks to be accessed independently. The LDPC decoder operation may be simplified by initializing some information into a memory in one of its processing modules instead of using an input buffer and by using incremental changes in extrinsic information to update different values during the iterative decoding process. In some embodiments, the LDPC decoder may perform High-speed digital demodulation and decoding units 125 may typically operate at an analog-to-digital converter (ADC) sample rate of at least twice the symbol rate of the optical signal to achieve acceptable performance levels. However, by including pulse-shaping filters in the digital coding and modulation unit 105 and the digital demodulation and decoding unit 125, at least a portion of the functionality of the digital demodulation and decoding unit 125 may be performed using a sampling rate that is closer to the symbol rate of the optical signal, thereby reducing the complexity and power consumption of the digital demodulation and decoding unit 125. Additionally, by using pulse-shaping filters and DACs during modulation, pre-compensation of non-ideal transmission conditions in the optical connection 115 may be performed by circuitry in the digital coding and modulation unit 105. Similarly, by using ADCs and pulse-shaping filters during demodulation, post-compensation of non-ideal transmission conditions in the optical connection 115 may be performed by circuitry in the digital demodulation and decoding unit 125.

Figure 2:
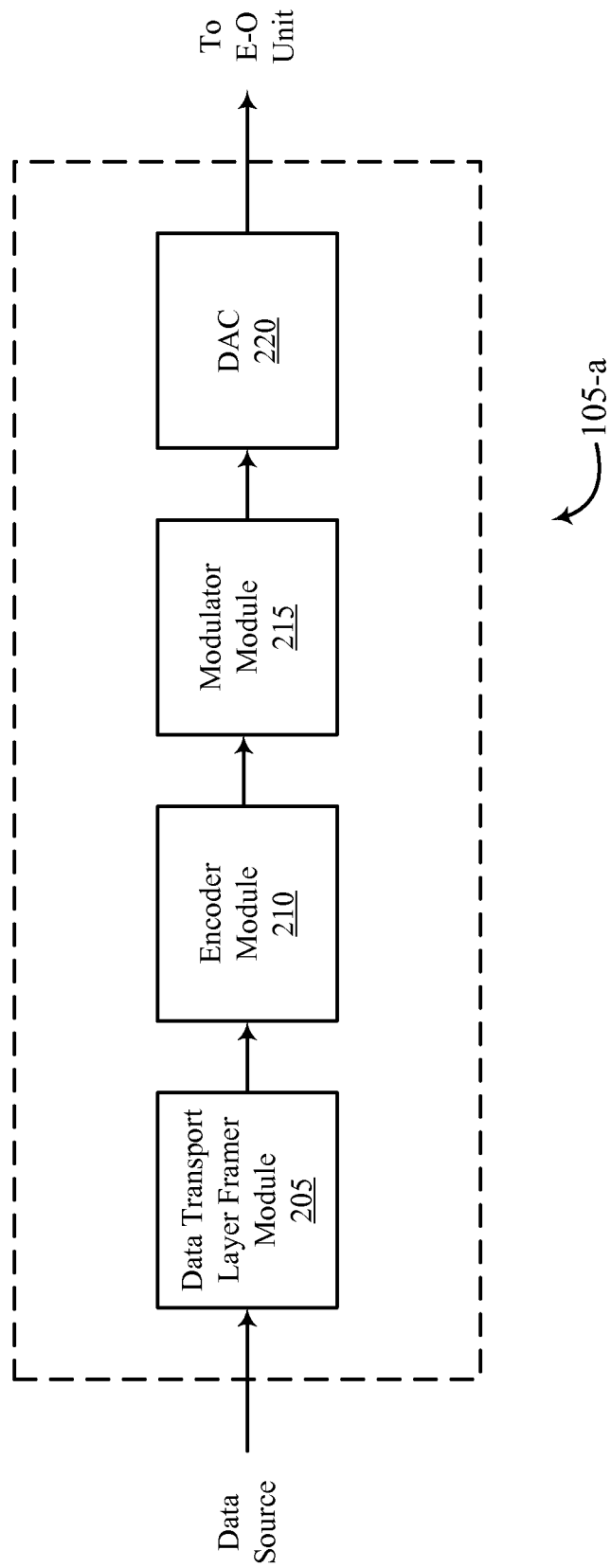
FIG. 2 is a block diagram of an example of a digital coding and modulation module according to various embodiments of the principles described herein.

FIG. 2 illustrates a digital coding and modulation unit 105-a. The digital coding and modulation unit 105-a may be an example of the digital coding and modulation unit 105 described above with reference to FIG. 1. In the illustrated embodiment, the digital coding and modulation unit 105-a includes a data transport layer framer module 205, an encoder module 210, a modulator module 215, and a DAC 220. Each of these components may be in communication, directly or indirectly.

The data transport layer framer module 205 may place the data received from the data source into packet frames for transmission. The packet frames may conform to one of many common protocols for packet frames used in optical communications systems which commonly include a header and a payload, and possibly a trailer, such as a cyclic redundancy check (CRC). As is well understood, the header may be interleaved with the payload during transmission, depending upon the particular protocol being used for optical transmission.

The encoder module 210 may calculate and add FEC information to the frames of data received from the data transport layer framer module 205. The particular type of FEC information of various embodiments may generally include systematically generated redundant error-correcting code (ECC) data that is transmitted along with the frames. In some embodiments, the encoder module 210 uses LDPC codes to generate the FEC information. The LDPC codes may be represented by a sparse parity check matrix and by an associated bipartite graph as described below with reference to FIG. 8

The modulator module 215 may perform pulse-shaping and pre-compensation filtering on the frames and FEC information, and modulate the frames and FEC information onto one or more sinusoidal waves generated in the digital domain, and forward the data to the DAC 220. The DAC 220 may convert the digital signal of the modulated data into an analog signal, which may be forwarded to an E-O unit (e.g., E-O unit 110) for conversion from the electrical domain to the optical domain.

Figure 3:
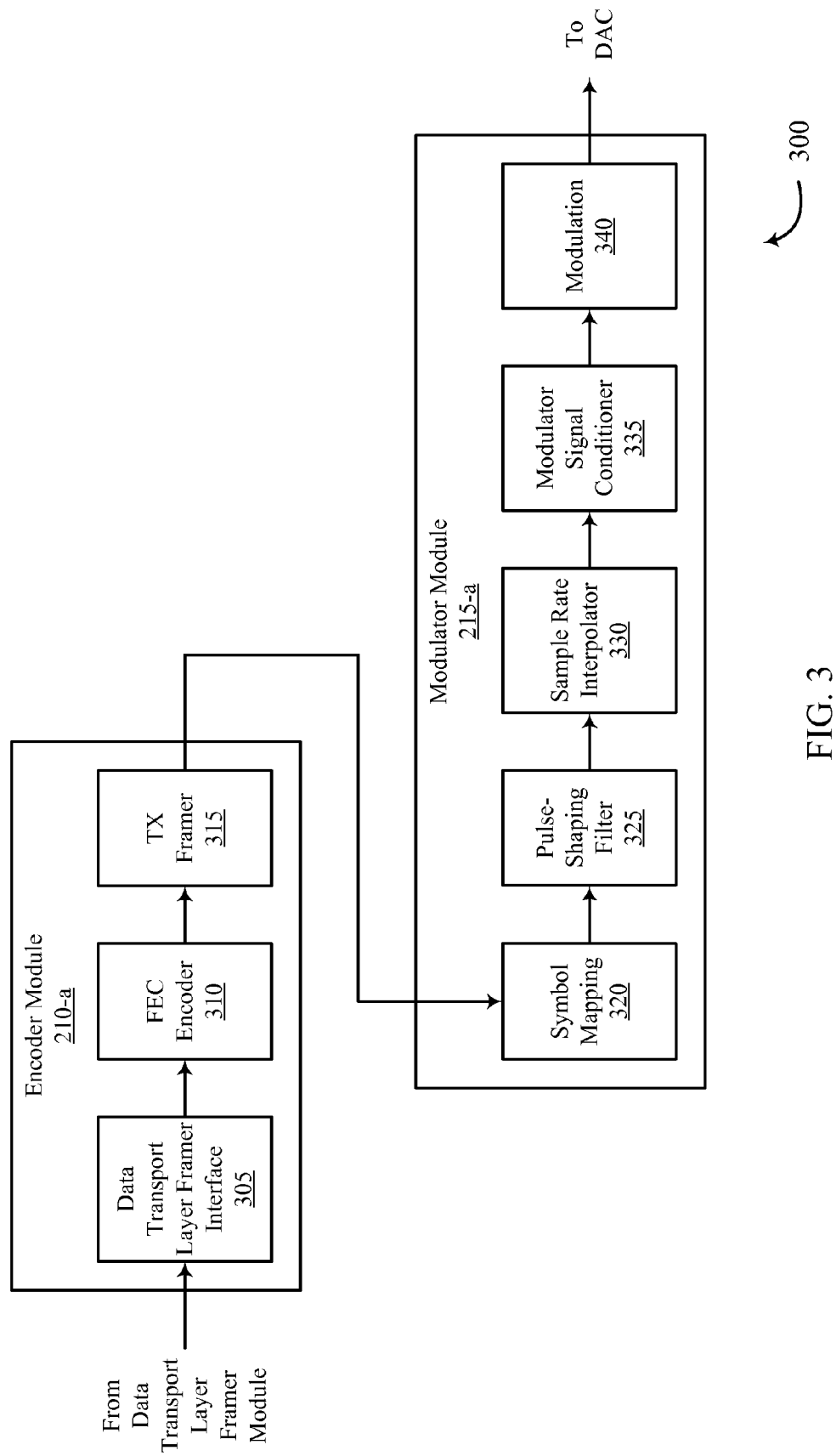
FIG. 3 is a block diagram of an example of an encoder and a modulator in a digital coding and modulation module according to various embodiments of the principles described herein.

FIG. 3 illustrates a system 300 that includes an encoder module 210-a and a modulator module 215-a. Each of these components may be in communication, directly or indirectly. The encoder module 210-a and the modulator module 215-a may be examples, respectively, of the encoder module 210 and the modulator module 215 described above with reference to FIG. 2.

As shown in FIG. 3, the encoder module 210-a includes a data transport layer framer interface module 305, an FEC encoder module 310, and a transmission (TX) framer module 315. The data transport layer framer interface module 305 may receive data to be transmitted from an application or other process external to the encoder 210-a. The data received from the data transport layer may be framed as one or more streams of serial bits for transmission.

The data transport layer framer interface module 305 may forward the data for transmission to the FEC encoder module 310. The FEC encoder module 310 may perform forward error correction on the data to be transmitted. The FEC encoder module 310 may encode the data to be transmitted using LDPC codes. The transmission framer module 315 may receive the FEC encoded bits and frame the bits for symbol mapping at the modulator 215-a.

The modulator module 215-a may include a symbol mapper module 320, a pulse-shaping filter module 325, a sample rate interpolator module 330, a modulator signal conditioner module 335, and a modulation module 340. Each of these components may be in communication, directly or indirectly.

The symbol mapper module 320 may receive the framed, encoded bits from the transmission framer 315 of the encoder and map the bits to modulation symbols according to a particular modulation scheme. The symbol-mapped bits may then be received at the pulse-shaping filter module 325 in multiples streams. At the pulse-shaping filter module 325, each of the streams may be filtered in the digital domain with at least one pulse-shaping filter. The at least one pulse-shaping filter may include a finite impulse response (FIR) filter or an infinite impulse response (IIR) filter with adjustable tap coefficients. The at least one pulse-shaping filter may be, for example, a root-raised cosine filter or other known pulse-shaping filter that may reduce or adjust the bandwidth associated with the streams symbol-mapped bits. Additionally or alternatively, each stream of symbol-mapped bits may be filtered using an adjustable time and/or frequency domain filter.

Additionally, the pulse-shaping filter module 325 may filter each stream of symbol-mapped bits to pre-compensate for at least one known or predicted non-ideal transmission condition. The non-ideal transmission condition may occur in the optical space, such as chromatic dispersion and/or timing skew that occurs when an optical signal is transmitted through an optical fiber or other optical medium or path. Additionally or alternatively, the non-ideal transmission condition may occur in the electrical domain. For example, the non-ideal transmission condition may include a non-linear amplifier response at the transmitting or receiving end, or component or channel roll-off that occurs in a DAC, an ADC, or another electrical component.

In certain examples, the non-ideal transmission condition may be predicted or determined based on measurements taken at one or more points in the transmitter, the signal path, or the receiver. For example, a receiver may measure a certain degree of chromatic dispersion in a received optical signal and communicate with the transmitter to provide data about the measured chromatic dispersion. Additionally or alternatively, the non-ideal transmission condition may be modeled or estimated based on known properties of electrical and/or optical components in the signal path between the transmitter and the receiver.

The pulse-shaping filter module 325 may pre-compensate for the at least one identified non-ideal transmission condition by calculating or estimating an effect of the non-ideal transmission condition on the transmitted optical signal and filtering the streams of symbol-mapped bits to at least partially reverse, lessen, or compensate the effect of the non-ideal transmission condition(s). In certain examples, separate filters may be used to create the root-raised cosine pulse shape and to pre-compensate for non-ideal transmission conditions. Alternatively, a single digital filter may be used for each stream to both shape the pulses into the desired root-raised cosine shape and to make further adjustments to the shape of the pulses to pre-compensate for the non-ideal transmission conditions.

The pulse-shaping filter(s) of the pulse-shaping filter module 325 may be dynamically tunable through the use of changeable filter tap coefficients. In certain examples, the type of filter itself may be dynamically changed to pre-compensate for a non-ideal transmission condition. For example, one or more filters in the pulse-shaping filter module 325 may be dynamically changed from a root-raised cosine filter to a simple raised-cosine filter, a Gaussian filter, or a sinc-shaped filter if such a change would more effectively pre-compensate for a known or predicted non-ideal transmission condition.

Additionally, in certain examples it may be possible to dynamically customize the filtering performed at each stream of symbol-mapped bits. For example, when the symbol mapper module 320 produces HI, HQ, VI, and VQ streams, it may be determined that an optical transmission path introduces a timing skew between the HI and HQ streams, but not between the VI and VQ streams. In this example, the properties of a pulse-shaping filter associated with the HI and/or HQ streams may be adjusted to pre-compensate for the timing skew without making adjustments to the VI and VQ streams.

The output of the pulse-shaping filter module 325 may be received at the sample rate interpolator module 330. The sample rate interpolator module 330 may add bits to each of the streams of symbol-mapped bits to increase the sample rate of each stream, for example, to twice the symbol rate. The modulator signal conditioner module 335 may receive the output of the sample rate interpolator module 330 and may perform additional filtering on each of the streams in the digital domain. For example, the modulator signal conditioner module 335 may perform direct current (DC) bias compensation. Additionally or alternatively, the modulator signal conditioner module 335 may filter the streams to compensate for amplitude/amplitude (AM/AM) non-linearity caused by driving amplifiers into saturation and/or amplitude/phase non-linearity. The modulator signal conditioner module 335 may include tunable digital domain filters that may be dynamically adjusted as changes in DC bias or amplifier non-linearity are detected, predicted, or determined. In some embodiments, some or all of the functionality of the modulator signal conditioner module 335 is performed at the phase-shaping filter module 325.

The output of the modulator signal conditioner module 335 may be received by the modulation module 340. The modulation module 340 may generate sinusoidal waves or waveforms in the digital domain and modulate the filtered, upsampled, and conditioned symbol-mapped bits that are output by the modulator signal conditioner module 335 onto the sinusoidal waveforms. In certain examples, the sinusoidal waveforms may have a relatively low intermediate frequency.

The modulated waves may be output by the modulation module 340 to one or more DACs (not shown), which may convert each modulated carrier wave from the digital domain to the analog domain. The waveforms in the analog domain that are output by the DAC(s) may undergo amplification and additional conditioning. When H and V polarizations are used, the amplified and conditioned waveforms may be converted into separate H and V optical signals at an E-O unit (not shown).

Figure 4:
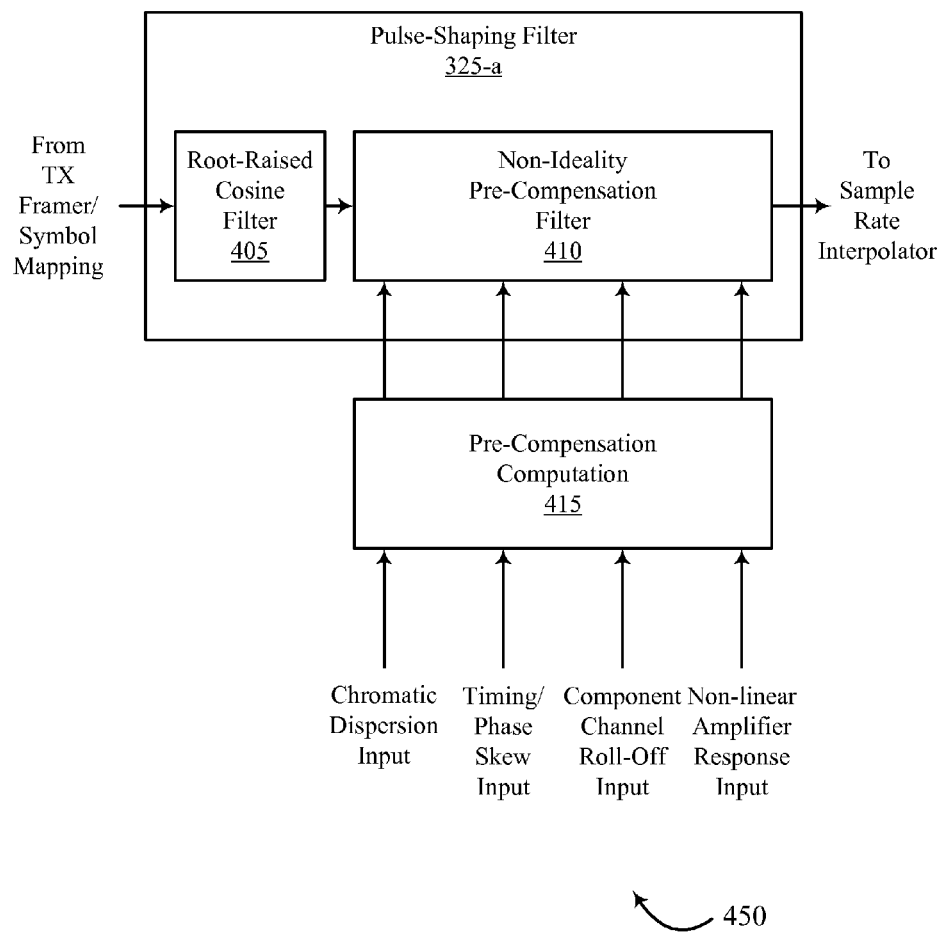
FIG. 4 is block diagram of an example of a pulse-shaping filter module according to various embodiments of the principles described herein.

FIG. 4, a system 450 is shown in which a pulse-shaping filter module 325-a is coupled to a pre-compensation computation module 415. The pulse-shaping filter module 325-a may be an example of the pulse-shaping filter module 325 described above with reference to FIG. 3.

The pulse-shaping filter module 325-a may include a root-raised cosine filter module 405 and a non-ideality pre-compensation filter module 410. The root-raised cosine filter module 405 may filter incoming streams of symbol-mapped bits (e.g., pulses of high and low voltages) to form the bits into a root-raised cosine shape. This root-raised cosine filter module 405 may reduce the bandwidth of the streams, thereby reducing inter-symbol interference. Additionally or alternatively, other types of pulse-shaping filters may be used, including, but not limited to, boxcar filters, sinc filters, raised-cosine filters, Gaussian filters, and the like.

The non-ideality pre-compensation filter module 410 may filter the streams of symbol-mapped bits in the digital domain to compensate for one or more predicted, determined, or known non-ideal transmission conditions. The non-ideality pre-compensation filter module 410 may receive input regarding chromatic dispersion in the signal path, input regarding timing phase or skew occurring in the signal path, input regarding component channel roll-off in the transmitter or receiver, and input regarding non-linear amplifier response in either the transmitter or the receiver. In other embodiments, input regarding more or fewer non-ideal transmission conditions may be received at the non-ideality pre-compensation filter module 410.

The input received by non-ideality pre-compensation filter module 410 may be used to generate a filtering function in the digital domain which is substantially inverse to a measured, a determined, or a predicted effect of the non-ideal transmission condition(s) to mitigate the detrimental effects of the identified non-ideal transmission conditions. In certain examples, the substantially inverse filtering functions may be pre-programmed or retrievable in memory. Additionally or alternatively, the input may include filter tap coefficients that weight certain aspects of one or more pulse-shaping filters to pre-compensate for the identified non-ideal transmission condition(s). The input may be received directly from an external application or process or statically stored in a register. In certain examples, the input may include active feedback and/or measurements received by one or more components within the signal path of the optical signal. For example, a first device may transmit an optical signal to a second device, and the second device may measure one or more non-ideal transmission conditions based on the received optical signal and transmit the measurements or other feedback based on the measurements back to the first device.

In certain examples, the root-raised cosine filter module 405 and the non-ideality pre-compensation filter module 410 may be implemented by a single discrete filter for each stream of symbol-mapped bits. Alternatively, the symbol-mapped bits may be sequentially filtered by a root-raised cosine filter and a non-ideality pre-compensation filter. In certain examples, the order in which each stream undergoes root-raised cosine filtering and non-ideality pre-compensation filtering may vary. In certain examples, the order of filtering may be dynamically modified to achieve a most favorable result. Moreover, in certain examples, a first stream (e.g., HI stream) of symbol-mapped bits may be passed through root-raised cosine filtering and non-ideality pre-compensation filtering in a different order than a second stream (e.g., VQ stream) of symbol-mapped bits.

The pre-compensation computation module 415 may receive input from an external application, process, or device and/or from one or more registers storing saved or default input regarding non-ideal transmission conditions. The input may be used by the pre-compensation computation module 415 to compute a set of filter tap coefficient values for a discrete pulse-shaping filter implementing at least the non-ideality pre-compensation filter module 410. In certain examples, the pre-compensation computation module 415 may compute the filter tap coefficient values based on a weighted consideration of the totality of the received input. Additionally or alternatively, the pre-compensation computation module 415 may compute the filter tap coefficient values based on a one-to-one correlation between non-ideal transmission conditions and filter tap coefficient values.

Figure 5:
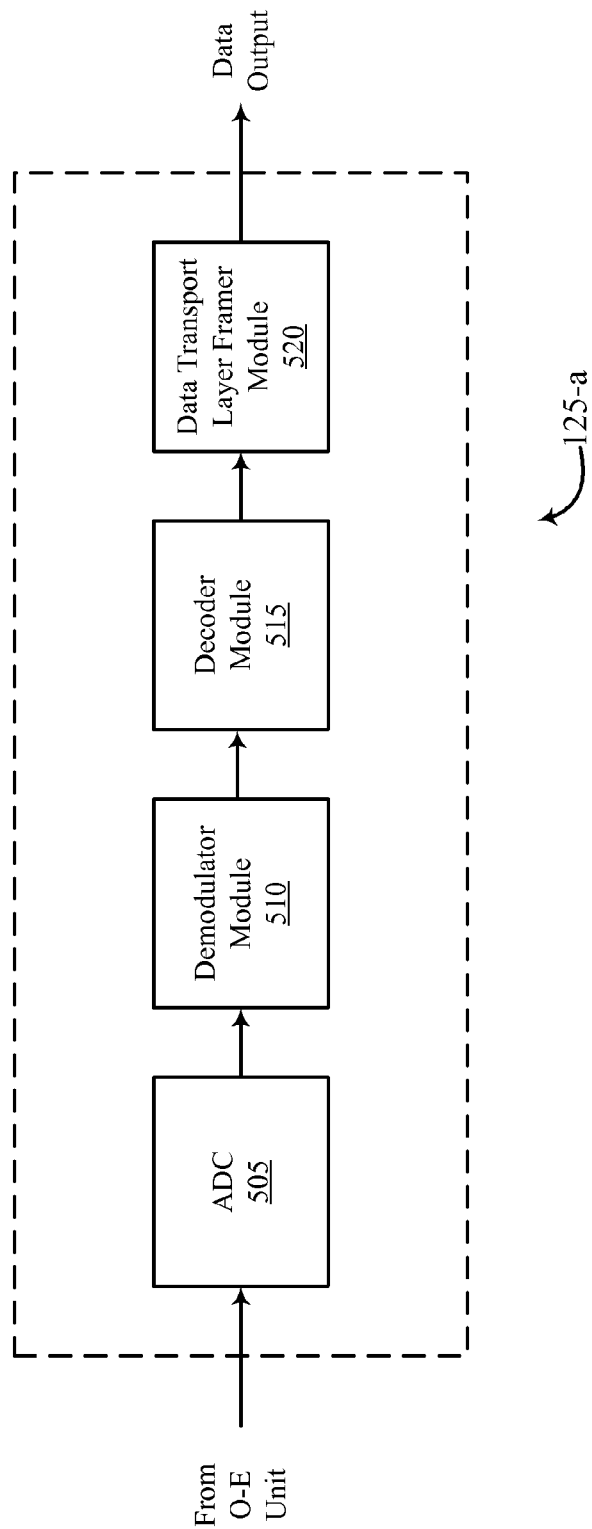
FIG. 5 is a block diagram of an example of a digital demodulation and decoding module according to various embodiments of the principles described herein.

As illustrated in FIG. 5, an example of a digital demodulation and decoding unit 125-*a* is shown. The digital demodulation and decoding unit 125-*a* may be an example of the digital demodulation and decoding unit 125 described above with reference to FIG. 1. In this embodiment, the digital demodulation and decoding unit 125-*a* includes an ADC 505, a demodulator module 510, a decoder module 515, and a data transport layer framer module 520. Each of these components may be in communication, directly or indirectly.

The ADC 505 may sample an electrical and analog version of an optical and analog signal received by an O-E unit (not shown). The optical signal from the E-O unit may have been transmitted at a data transmission rate of 40 Gbps, 100 Gbps, or higher, for example. Moreover, when the data from the optical signal is coherently received, phase information included in the optical signal is preserved after the O-E unit 120 transforms the data in the optical signal to the electrical domain. The ADC 505 may provide a digitally sampled version of the optical/analog signal to the demodulator module 510, which demodulates the digitally-sampled signal and provides the demodulated data to the decoder module 515. The demodulator module 510 may also compensate for non-ideal transmission conditions.

The decoder module 515 performs FEC decoding on the demodulated data, and may correct transmission errors identified from error-correcting code. During FEC decoding, the decoder module 515 may use a decoder (not shown) that is based on LDPC codes. LDPC codes may be represented by a sparse parity check matrix and by an associated bipartite graph with bit nodes, check nodes, and connecting edges as described below with reference to FIG. 8. The LDPC decoder may have an edge memory (e.g., RAM) configured to have a first bank of memory partitions and a second bank of memory partitions that allow the LDPC decoder to perform twice the number of check node operations without having to double the edge memory. For example, by having the first bank of the edge memory independently handle access to extrinsic information for edges corresponding to a first set of N check nodes and the second bank of the edge memory independently handle access to extrinsic information for edges corresponding to a second set of N check nodes, the LDPC decoder may be able to process 2N check nodes in parallel instead of the typical N check nodes, which is what the LDPC code may support. The edge memory may have two sets of read/write ports that allow for each of the banks to be accessed independently. The LDPC decoder operation may be simplified by initializing some information into a memory in one of its processing modules instead of using an input buffer and by using incremental changes to update different values during the iterative decoding process. The decoder module 515 provides the decoded and corrected data to the data transport layer framer module 520, which frames (or de-frames) the data from the signal according to the particular protocol used in the optical transmission, and provides output data. The data may be output to, for example, a user or any receiving system.

Figure 6:
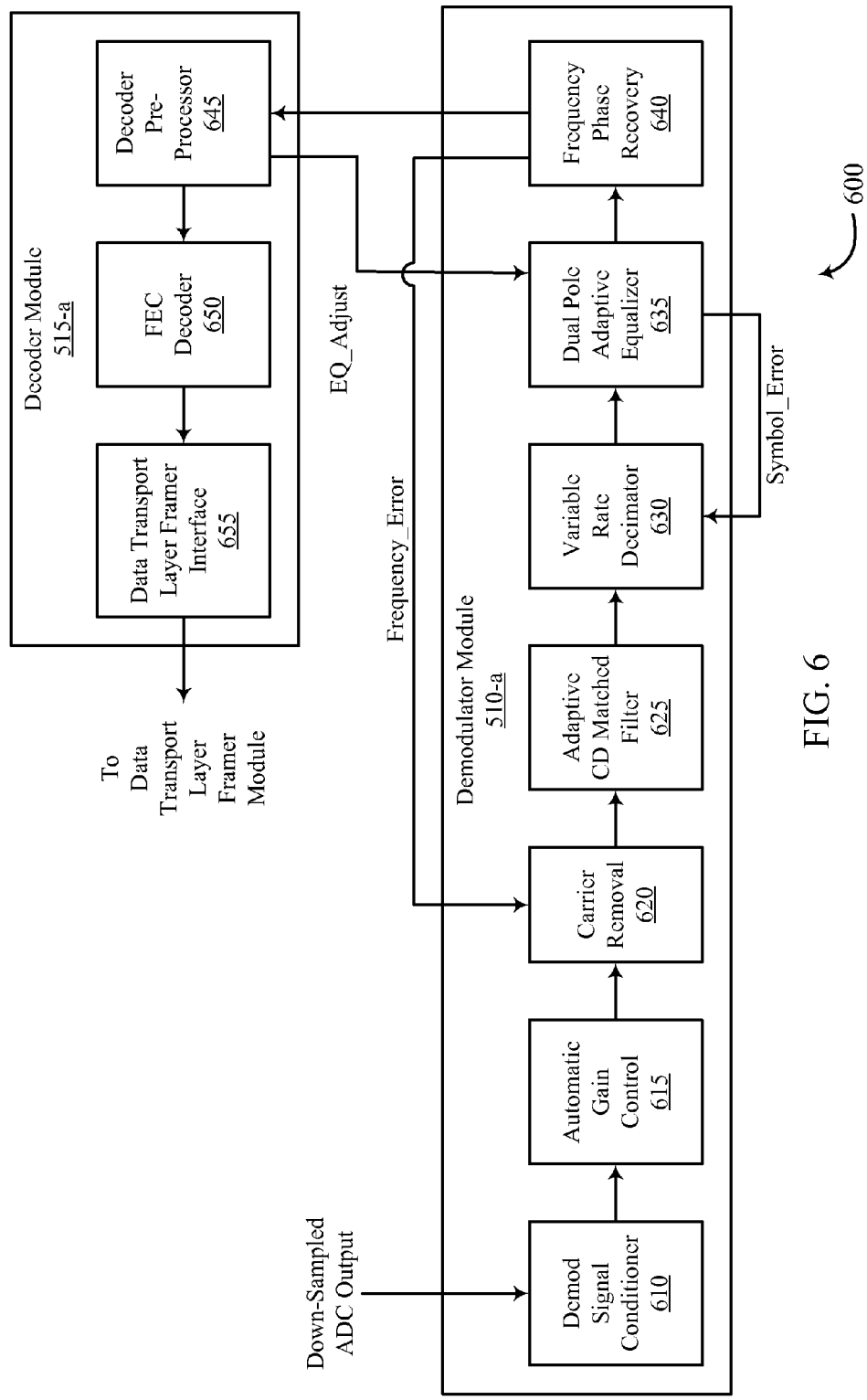
FIG. 6 is a block diagram of an example of a demodulator and a decoder according to various embodiments of the principles described herein.

FIG. 6 is a block diagram of a system 600 that includes a demodulator module 510-*a* and a decoder module 515-*a*. Each of these components may be in communication, directly or indirectly. The demodulator module 510-*a* and the decoder module 515-*a* may be respective examples of the demodulator module 510 and the decoder module 515 described above with reference to FIG. 5.

The demodulator 510-*a* may include a demodulator signal conditioner module 610, an automatic gain control module 615, a carrier removal module 620, an adaptive chromatic dispersion (CD) matched filter module 625, a variable rate decimator 630, a dual pole adaptive equalizer module 635, and a frequency phase recovery module 640.

Through the use of pulse-shaping to reduce inter-symbol interference and the effects of non-ideal transmission conditions, it may be possible to perform some of the filtering and other preliminary demodulation steps on a version of the optical signal that is sampled at or near the baud rate (e.g., the symbol rate) of the optical signal. However, an ADC that samples the optical signal at a rate of twice the symbol rate may be more readily obtainable and less expensive than an ADC that samples at or near the baud rate of the optical signal. Therefore, in some embodiments, an ADC that samples at twice the symbol rate may be used, and the output of the ADC may be down-sampled to just over the baud rate of the optical signal (e.g., between 1.0 and 1.3 times the baud rate).

The demodulator signal conditioner module 610 may receive the down-sampled version from the ADC and perform preliminary filtering on the received sampled version of the optical signal. The automatic gain control module 615 may automatically adjust the gain of the down-sampled version of the optical signal to bring the amplitude of the modulated carrier wave into an acceptable range. The carrier removal module 620 may then extract the symbol-mapped bits from the carrier frequency according to the modulation scheme used in the optical signal.

The adaptive CD matched filter 625 may filter the symbol-mapped bits to compensate for chromatic dispersion in the optical transmission path. In certain examples, the adaptive CD matched filter 625 may match one or more filters in the modulator of the device transmitting the optical signals. The variable rate decimator module 630 may adjust the sampling rate of the symbol-mapped bits such that each stream of symbol-mapped bits is at a sampling rate that will allow for minimal inter-symbol interference during equalization. In certain cases, the variable rate decimator module 630 may up-sample the extracted and filtered symbol-mapped bits to the original sample rate of the ADC (e.g., twice the symbol rate). The dual pole adaptive equalizer module 635 performs additional filtering on the streams of symbol-mapped bits in the digital domain to reduce inter-symbol interference and allow for the recovery of the modulated data. The dual pole adaptive equalizer module 635 may perform an inverse or matched filtering function of one or more pulse-shaping filters in the transmitter. The dual pole adaptive equalizer module 635 may be configured to support one or more polarizations in the modulation scheme.

After equalization is performed, the frequency phase recovery module 640 may recover the encoded bits based on symbols representing changes in the phase of the modulated carrier frequency. The encoded bits may be recovered from the symbols using information about the constellation diagram that is representative of the modulation scheme used to transmit the optical signal. In some embodiments, additional or separate modules may be used as appropriate to demodulate the encoded data from the recovered symbols.

The decoder module 515-*a* of the present example includes a decoder pre-processor module 645, an FEC decoder module 650, and a data transport layer framer interface module 655. Each of these components may be in communication, directly or indirectly.

The decoder pre-processor module 645 may enforce a set of rules to ensure the integrity and validity of the encoded data received from the demodulator module 510-*a*. The FEC decoder module 650 may perform forward error correction on the encoded bits to identify and correct errors and reconstruct the originally transmitted stream of data.

The FEC decoder module 650 may support LDPC decoding, for example. During FEC decoding, the FEC decoder module 650 may have an associated edge memory (e.g., RAM) configured to have a first bank of memory partitions and a second bank of memory partitions that allow the FEC decoder module 650 to double the number of check node processing operations having to double the edge memory. The first bank of memory partitions may store extrinsic information for edges that are used in connection with one set of N check nodes associated with the iterative LDPC decoding process. The second bank of memory partitions may store extrinsic information for edges that are used in connection with another set of N check nodes associated with the iterative LDPC decoding process. The first bank and the second bank are concurrently accessed to enable processing of 2N check nodes in parallel, thereby doubling the processing ability of the FEC decoder module 650. The edge memory may have two sets of read/write ports that allow for each of the banks to be accessed independently. The operation of the FEC decoder module 650 may be simplified by initializing some information into a memory in one of its processing modules instead of using an input buffer and by using incremental changes in extrinsic information to update different values during the iterative decoding process. The data transport layer framer interface 655 may forward the originally transmitted stream of data to a data transport layer framer for processing and delivery.

Figure 7:
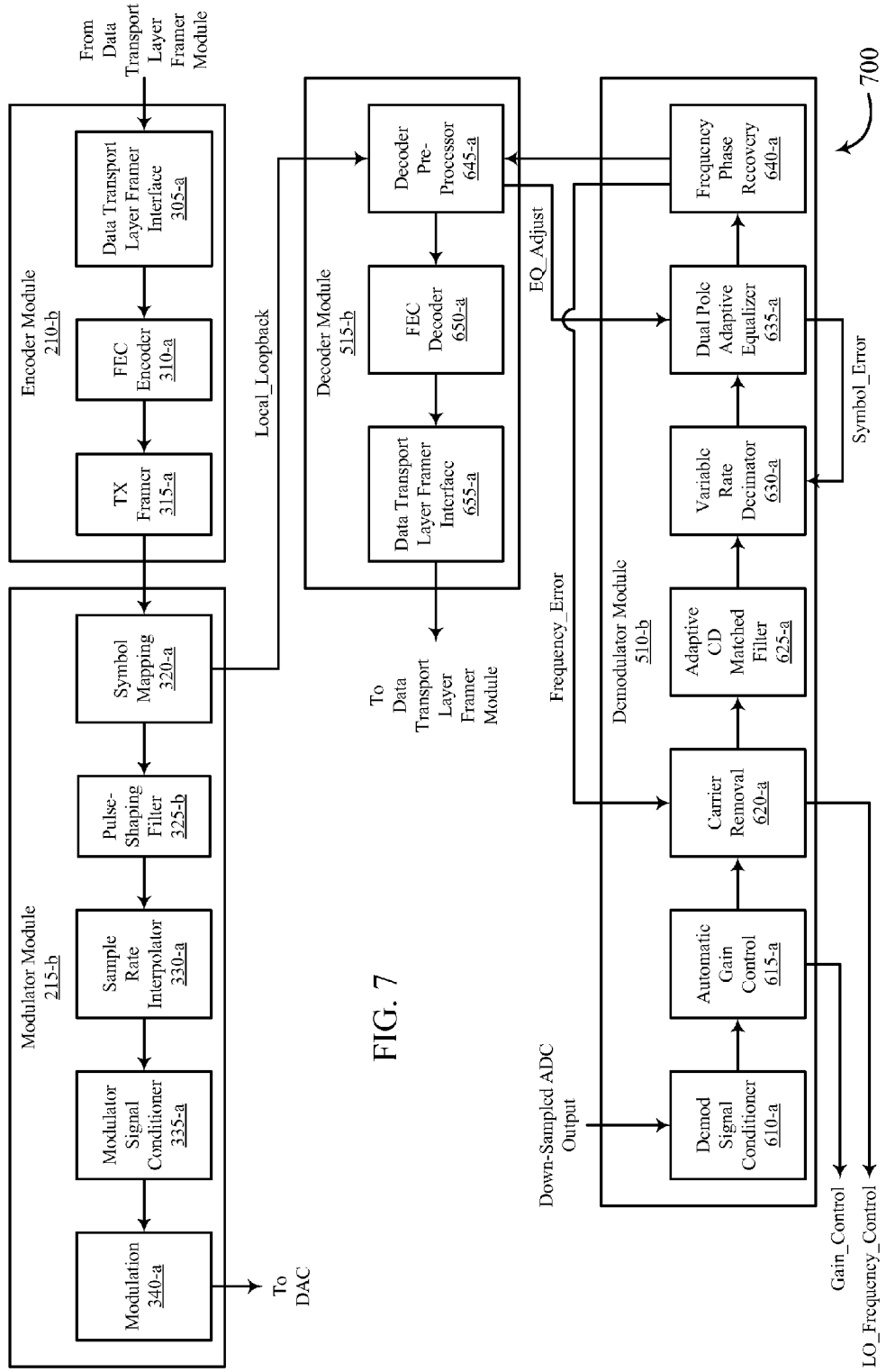
FIG. 7 is a block diagram of an example of an optical modem according to various embodiments of the principles described herein.

FIG. 7 illustrates a block diagram of an example of a modem device 700. The modem 700 includes an encoder module 210-*b*, a modulator module 215-*b*, a demodulator module 510-*b*, and a decoder module 515-*b*. The encoder module 210-*b* may be an example of the encoder modules 210 and 210-*a* described above with reference to FIG. 2 and FIG. 3, respectively. The modulator module 215-*b* may be an example of the modulator modules 215 and 215-*a* described above with reference to FIG. 2 and FIG. 3, respectively. The demodulator module 510-*b* may be an example of the demodulator modules 510 and 510-*a* described above with reference to FIG. 5 and FIG. 6, respectively. The decoder module 515-*b* may be an example of the decoder modules 515 and 515-*a* described above with reference to FIG. 5 and FIG. 6, respectively.

The encoder module 210-*b* may include a data transport layer framer interface module 305-*a*, an FEC encoder module 310-*a*, and a TX framer module 315-*a*. These components may be examples of the data transport layer framer interface module 305, the FEC encoder module 310, and the TX framer module 315 described above with reference to FIG. 3. The modulator module 215-*b* may include a symbol mapper module 320-*a*, a pulse-shaping filter module 325-*b*, a sample rate interpolator module 330-*a*, a modulator signal conditioner module 335-*a*, and a modulation module 340-*a*. These components may be examples of the symbol mapper module 320, the pulse-shaping filter module 325, the sample rate interpolator module 330, the modulator signal conditioner 335, and the modulation module described above with reference to FIG. 3. Additionally, the pulse-shaping filter 325-*b* may be an example of the pulse-shaping filter 325-*a* described above with reference to FIG. 4.

The demodulator module 510-*b* of the example in FIG. 7 may include a demodulator signal conditioner module 610-*a*, an automatic gain control module 615-*a*, a carrier removal module 620-*a*, an adaptive CD matched filter module 625-*a*, a variable rate decimator module 630-*a*, a dual pole adaptive equalizer module 635-*a*, and a frequency phase recovery module 640-*a*. These components may be examples of the demodulator signal conditioner module 610, the automatic gain control module 615, the carrier removal module 620, the adaptive CD matched filter module 625, the variable rate decimator module 630, the dual pole adaptive equalizer module 635, and the frequency phase recovery module 640 described above with reference to FIG. 6.

The decoder module 515-*b* may include a decoder pre-processor module 645-*a*, an FEC decoder module 650-*a*, and a data transport layer framer interface 655-*a*. These components may be examples of the decoder pre-processor module 645, the FEC decoder module 650, and the data transport layer framer interface module 655 described above with reference to FIG. 6. The FEC decoder module 650-*a* may be an LDPC decoder with a single or combined RAM that is used as a single edge memory, where the RAM may be configured to have two separate banks of memory partitions that may be accessed at the same time to allow the FEC decoder module 650-*a* to double the number of check node operations it can perform without having to use two edge memories.

As shown in FIG. 7, components of the modulator module 215-*b*, the decoder module 515-*b*, and the demodulator module 510-*b* may interact with each other. For example, the symbol mapper module 320-*a* of the modulator module 215-*b* may provide local loopback feedback signal (Local_Loopback) to the decoder pre-processor module 645-*a* to increase the accuracy of the decoder pre-processor module 645-*a*. The decoder pre-processor module 645-*a* may provide an equalizer adjustment feedback signal (EQ_Adjust) to the dual pole adaptive equalizer 635-a of the demodulator 510-b to dynamically adjust the equalization filtering at the demodulator module 510-c.

The frequency phase recovery module 640-a of the demodulator module 510-b may provide a frequency error signal (Frequency_Error) to the carrier removal module 620-a to allow the carrier removal module 620-a to achieve frequency lock with the carrier frequency. The dual pole adaptive equalizer module 635-a may provide a symbol error feedback signal (Symbol_Error) to the variable rate decimator module 630-a to allow the variable rate decimator module 630-a to dynamically adjust the sampling rate and reduce inter-symbol interference. The carrier removal module 620-a may provide a local oscillator frequency control signal (LO_Frequency_Control) to correct the frequency of a local oscillator signal that is used to demodulate the received optical signal. Additionally, the automatic gain control 615-a may provide a gain control signal (Gain_Control) that is based on the gain being applied to the amplitude of the modulated carrier wave.

Figure 8:
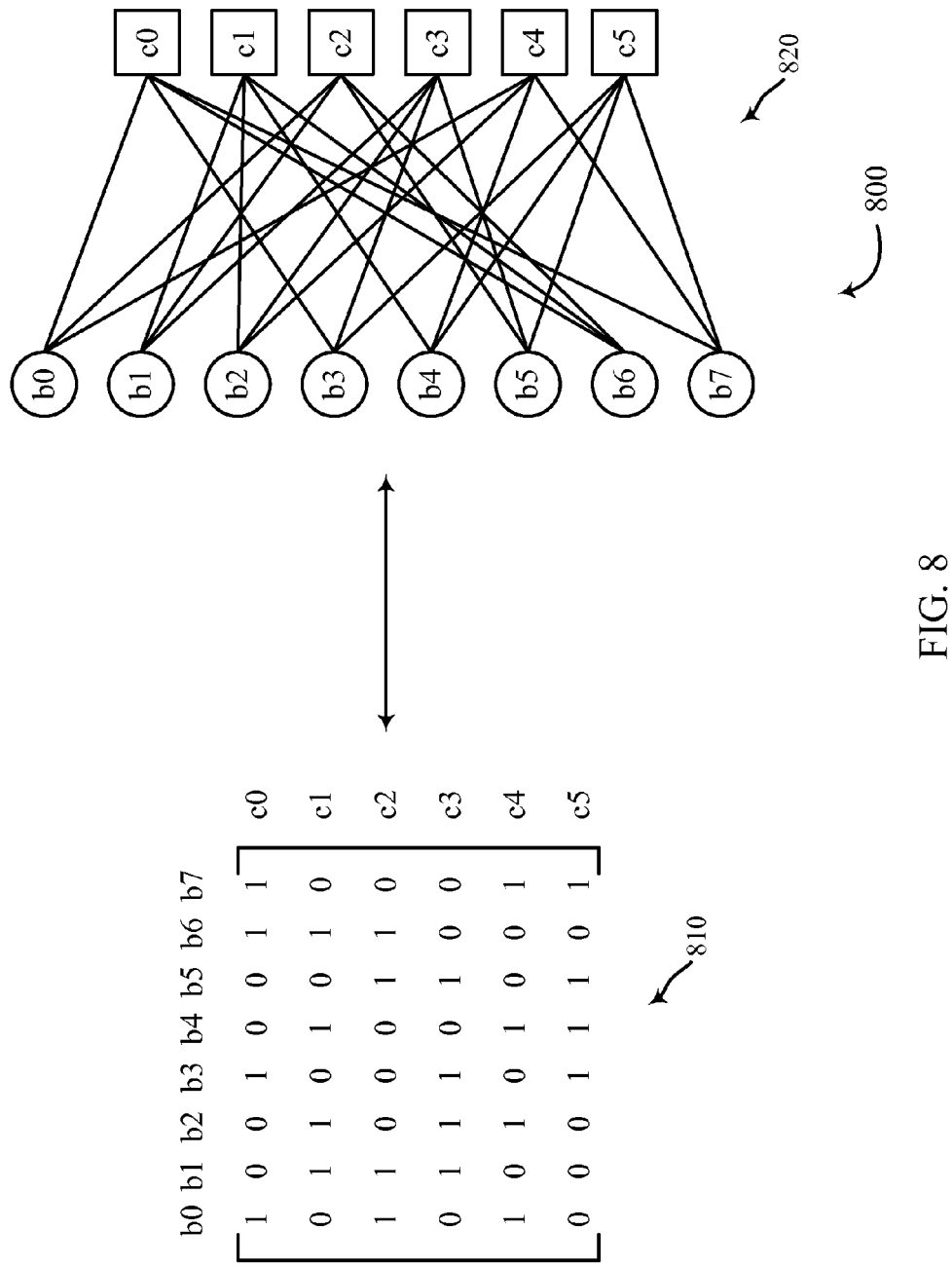
FIG. 8 is a diagram that illustrates an example of sparse parity check matrix and associated bipartite graph according to various embodiments of the principles described herein.

FIG. 8 shows a diagram 800 that illustrates an example of a sparse parity check matrix 810 and an associated bipartite graph 820. In the bipartite graph 820, each bit node b0-b7 represents a corresponding column in the parity check matrix 810, and each check node c0-c5 represents a corresponding row in the parity check matrix 810. The example parity check matrix 180 is not an actual LDPC parity check matrix, and is provided for illustrative purposes only. Each "1" represents a bit involved in a parity check. Thus, for each code word a=[$a_0$, $a_1$, ... $a_7$] received, the parity checks are based on:

$a_0 + a_3 + a_6 + a_7$, $a_1 + a_2 + a_4 + a_6$ ...

etc. The received code word may be represented by soft information, the values of which may be used to initialize a matrix according to the parity check matrix 810 for iterative decoding. For example, if the soft information generated from a received code word is [0.22, 0.17, 0.78, 0.80, 0.87, 0.10, 0.25, 0.33], then an initialized matrix X according to the parity check matrix 810 would be:

$$\begin{bmatrix} 0.22 & & & 0.80 & & & 0.25 & 0.33 \\ & 0.17 & 0.78 & & 0.87 & & 0.25 & \\ 0.22 & 0.17 & & & & 0.10 & 0.25 & \\ & 0.17 & 0.78 & & & 0.10 & & \\ 0.22 & & 0.78 & 0.80 & 0.87 & & & 0.33 \\ & & & 0.80 & 0.87 & 0.10 & & 0.33 \end{bmatrix}$$

Each connection between a bit node and a check node is referred to as an edge, and corresponds to a "1" in the parity check matrix. Because the parity check matrix 810 has a column weight of 3 and a row weight of 4, each bit node is connected to three edges and each check node is connected to four edges. During the iterative decoding process, each check node provides a bit node estimate to a bit node based on information from other related bit nodes. Each bit node, in return, provides an estimate of its own value based on information from other related check nodes. The process continues until all parity check equations are satisfied, indicating a valid decode, or until a maximum number of iterations is reached without satisfying all parity check equations, indicating a decoding failure. In some cases, the maximum number of iterations may be dynamically adjusted to control that rate at which a valid decode and a decoding failure are determined.

During decoding, a value may be assigned to each edge of the bipartite graph 820 that is representative of a channel value associated with a bit node to which the edge is connected. Check nodes are then updated by accumulating the edge values according to a log-likelihood G operation G:

$$G(a, b) = \ln \frac{1 + e^{a+b}}{e^a + e^b}$$

Bit nodes may thereafter be updated with the update edge values by summing the edge values associated with the bit node. Thereafter, the system determines if all parity equations are satisfied or if a maximum number of iterations has been reached if all parity equations are not satisfied.

The interconnection between the bit nodes and check nodes in an LDPC code is typically pseudo-random. To facilitate high-speed decoding with reasonable complexity, a structure is often imparted in the code design so that the connections to the check nodes for a group of bit nodes are a linear translation of each other, i.e., some or all of the parity equations may be a linear translation of one particular parity equation. For example, a parity check matrix may define the following sets of linearly shifted parity check equations (1) and (2):

$$a_0 + a_8 + a_{16} + a_{32} = 0, \quad (1)$$
$$a_1 + a_9 + a_{17} + a_{33} = 0,$$
$$a2 + a_{10} + a_{18} + a_{34} = 0 \ldots$$

$$a_0 + a_{10} + a_{20} + a_{30} = 0, \quad (2)$$
$$a_1 + a_{11} + a_{21} + a_{31} = 0,$$
$$a2 + a_{12} + a_{22} + a_{32} = 0 \ldots$$

etc. Thus, in the linearly shifted parity check equation (1), operands $a_0$, $a_1$ and $a_2$ correspond to the first operand $a_p$, operands $a_8$, $a_9$ and $a_{10}$ correspond to the second operand $a_{p+8}$, and so on. Such a code structure facilitates parallelizing the decoding process.

Memory size and access can present unique implementation challenges. Multiple bits of soft-extrinsic information for all the edges between bit nodes and check nodes are to be accommodated and stored. The memory for storing such information is often referred to as edge memory. Additionally, during the iterative decoding process, the bit node processors may require the original soft-input from the channel (i.e., soft channel information). The size of the memory depends on the block size, the resolution of soft-information, and also the average number of edges per bit, and may be relatively large for large block code sizes. Additionally, a highly-parallel decoder will read from and write to memory stores in a highly parallel fashion. In the case of DVB-S2, for example, 6 bits of information may be needed for each of the 360 edges that can be processed in parallel by the LDPC decoder, making the edge memory 2160 bits wide. Thus, for a degree of parallelism "p" the decoder may read and write p blocks of information at a time from these memories. For example, the sets of linearly shifted parity check equations (1) and (2) above define a first degree of parallelism p and a second degree of parallelism p. The values of p may differ for each degree of parallelism, e.g., the first degree of parallelism p may be 8, and the second degree of parallelism may be 16. The values of p may also be the same for some or all degrees of parallelism.

As illustrated above, powerful LDPC codes are based on complex interconnection of the bit nodes and check nodes, so gathering the data to perform highly parallel check node processing and bit node processing operations is a design challenge for efficient decoder implementation.

Figure 9:
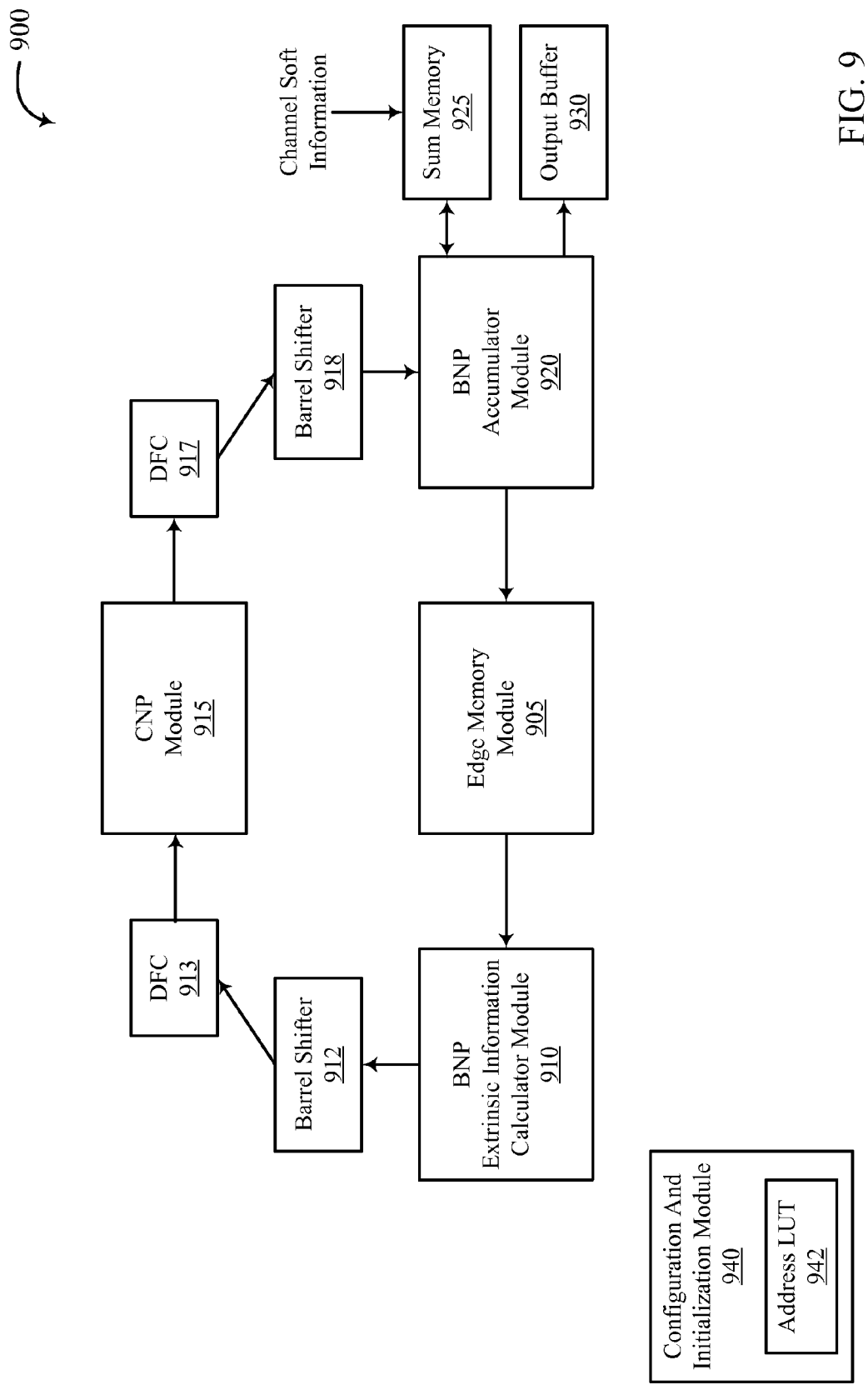
FIG. 9 is a diagram that illustrates an example of an LDPC decoder according to various embodiments of the principles described herein.

FIG. 9 is a block diagram that illustrates an example of an LDPC decoder 900, which may be an example of the FEC decoders 650 and 650-a of FIG. 6 and FIG. 7, respectively. The LDPC decoder 900 includes an edge memory module 905, a bit node processor (BNP) extrinsic information calculator module 910, a check node processor (CNP) module 915, a BNP accumulator module 920, a sum memory 925, and an output buffer 930. Also shown are a barrel shifter 912 and a data formatting circuit (DFC) 913 that may be configured to reorder and/or format the data provided by the BNP extrinsic information calculator module 910 to the CNP module 915. Similarly, a DFC 917 and a barrel shifter 918 may be configured to reorder and/or format the data provided by the CNP module 915 to the BNP accumulator module 920 and the edge memory module 905. Each of these components may be in communication, directly or indirectly.

The edge memory module 905 may be located at the center of the LDPC decoder 900, surrounded by the CNP module 915 and by the BNP processing modules 910 and 920, each with their own memories. Thus, the bit node processing performed by the LDPC decoder 900 may be split into two parts: one part is performed by the BNP accumulator module 920 and the other part is performed by the BNP extrinsic information calculator module 910. When the various processors in the CNP module 915 complete their processing and the edge information is ready to be written back to the edge memory module 905, the BNP accumulator module 920 may collect the channel information and the extrinsic information for those edges involved with a particular bit. At the other side of the of edge memory module 905, the extrinsic information from the previous CNP iteration is typically subtracted from the aggregated BNP values to create the new extrinsic information inputs for the new iteration of CNP.

As noted, the edge memory module 905 may store the extrinsic information of the edges for the LDPC code. For an LDPC code block of 64 kilobits, there may be an average of three to four edges per bit. Moreover, to provide sufficient resolution for good performance, the extrinsic information for every edge may need to be a 6 bit or higher resolution number. In highly parallel designs, the edge memory module 905 may need to allow massively parallel read and write ports to support BNP and CNP parallel processing. So the edge memory module 905 may need to be large and be 2-port, while also being very wide and not so deep. Therefore, reading from and writing to edge memory module 905 may involve major complexity in high speed LDPC decoder designs. The novel decoder architecture herein may provide for faster processing speed by accessing extrinsic information for a larger number of edges from the edge memory module 905 when compared to conventional architectures.

Turning to a more specific example discussion of FIG. 9, channel soft information ($X_0$) is received and a configuration and initialization module 940 may initialize the channel soft information into the sum memory 925. The configuration and initialization module 940 may configure the edge memory module 905 and/or other memories in the LDPC decoder 900. The configuration and initialization module 940 may be part of the LDPC decoder 900, however, there may be cases in which it is implemented outside the LDPC decoder 900. The configuration and initialization module 940 may include an address lookup table (LUT) 942 that stores edge memory connectivity information used for configuring the edge memory module 905 such that the information is properly stored and accessed.

The BNP accumulator module 920 may include an array of parallel BNP processors to perform its part of the bit node processing. In addition to the initialized channel soft information, the BNP accumulator module 920 also receives the edge values coming from the CNP module 915, and sums these edge values with the original channel soft information for storage in the sum memory 925. The edge values may correspond to incremental changes in the extrinsic information for edges and may be stored in the edge memory module 905 through the BNP accumulator module 920 or directly from the DFC 917 and the barrel shifter 918. Rather than having two sets of sum values in the sum memory 925, one for a previous iteration and one for a current iteration, when an update is received from the CNP module 915 in the form of an incremental change, the existing sum value is updated and is made available for immediate use. In this way, there is no need to wait until all the current sum values are computed and the decoding process may be more aggressive.

The BNP extrinsic information calculator module 910, which performs the other part of the bit node processing, accesses the edge memory module 905, and generates extrinsic information for a particular edge by subtracting the original extrinsic information from the newly summed edge value of that edge. Thus, the BNP extrinsic information calculator module 910 may subtract extrinsic information of a previous CNP iteration from the accumulated BNP values to create the new extrinsic information inputs for the new iteration of CNP processing by the CNP module 915. Like the BNP accumulator module 920, the CNP module 915 may include an array of parallel CNP processors to perform check node processing.

In one embodiment, CNP involves the accumulation of values based on the log-likelihood operation G and its inverse G', where $$G(a, b) = \ln \frac{1 + e^{a+b}}{e^a + e^b},$$

and $$G'(a, b) = \ln \frac{1 + e^{a+b}}{e^a + e^b}.$$

For any edge, the output extrinsic information is equal to the G summation of the incoming extrinsic information on all the other edges. For example, in FIG. 8, the output extrinsic information for the edge connecting bit node b0 to check node c0 is the summation of the edges between check node c0 and bit nodes b3, b6 and b7. Likewise, the output extrinsic information for the edge connecting bit node b3 to check node c0 is the summation of the edges between check node c0 and bit nodes b0, b6 and b7, and so on.

Extrinsic information output for an edge may be generated by subtracting its incoming information from the accumulated information via a G' processing block. At any check node processor in the CNP module 915, the data for the different edges can be provided serially for a pipelined implementation or in batches for a parallel implementation. The BNP accumulator module 920 thereafter updates the bit nodes with the updated edge values by summing the edge values associated with the bit node and storing the sums in the sum memory 925. Thereafter, when a determination is made that all parity equations are satisfied, output data may be stored in the output buffer 930.

One approach to increase the throughput of an LDPC decoder like the LDPC decoder 900 is to increase the parallelism of its architecture. The LDPC codes used in a typical LDPC decoder are quasi-cyclic such that the codes by design have a certain parallelism built into them. For LDPC codes used in satellite communication applications, such as DVB-S2, this parallelism is 360. Therefore, it may be possible to implement an LDPC decoder that performs 360 operations in parallel (e.g., edges/clock). Having multiple copies of the LDPC decoder may be one way to increase parallelism and throughput. However, while having two copies of the LDPC decoder in a same device may lead to doubling the speed or processing capability, it also increases the complexity of the design. For example, two copies of the decoder involve having two copies of the edge memory, where the edge memory size tends to dominate the size of the decoder design. Instead of using two copies of the LDPC decoder (and two edge memories), another approach is to double the parallelism (e.g., perform 720 operations in parallel) by configuring the edge memory differently while doubling the processing capabilities of the decoder. That is, the RAM used for the edge memory may be organized such that data (e.g., extrinsic information) for a set of N check nodes is in one set of RAM partitions and data for another set of N check nodes is in another set of RAM partitions, where N is the number of operations that would typically be supported by the LDPC code structure used in the LDPC decoder 900. By allowing the LDPC decoder 900 to work on, for example, one set of 360 odd-numbered check nodes and one set of 360 even-numbered check nodes at the same time, the throughput of the LDPC decoder 900 may be doubled from 360 operations in parallel to 720 operations in parallel. In this manner, it may be possible to double the decoder parallelism without doubling the size of the edge memory, which is the biggest memory inside an LDPC decoder 900.

Figure 10:
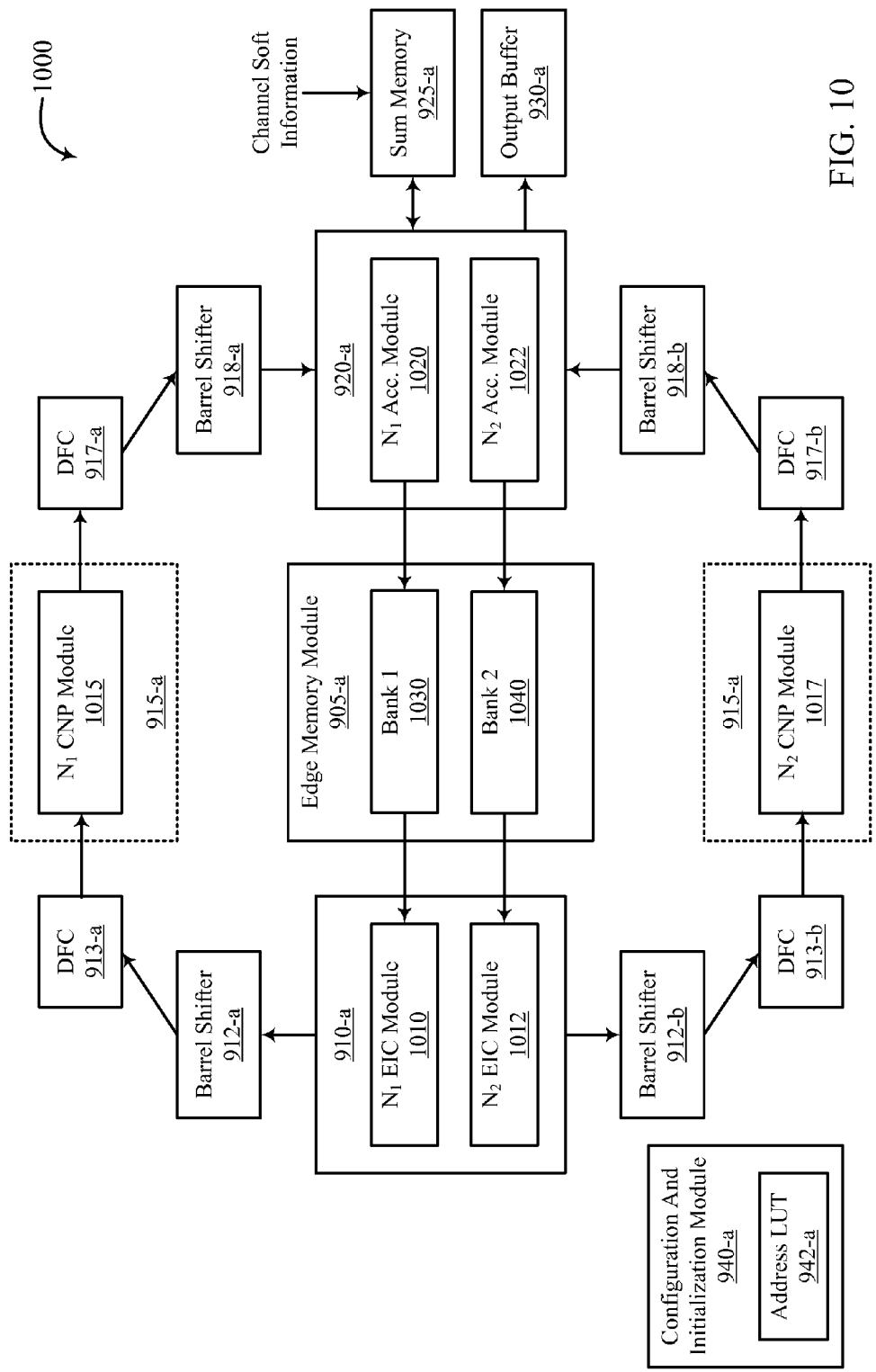
FIG. 10 is a diagram that illustrates another example of an LDPC decoder according to various embodiments of the principles described herein.

FIG. 10 is a block diagram that illustrates an example of an LDPC decoder 1000, which may be an example of the FEC decoders 650 and 650-*a* of FIG. 6 and FIG. 7, respectively. The LDPC decoder 100 may be a more specific architectural implementation of the LDPC decoder 900 of FIG. 9. The LDPC decoder 1000 includes an edge memory module 905-*a*, a BNP extrinsic information calculator (EIC) module 910-*a*, CNP module 915-*a*, a BNP accumulator module 920-*a*, a sum memory 925-*a*, and an output buffer 930-*a*. Each of these components may be in communication, directly or indirectly. The architecture of the LDPC decoder 1000 supports doubling the processing capabilities of the decoder by using two processing paths in parallel, one for a first set of check nodes ($N_1$) and another for a second set of check nodes ($N_2$), where $N_1=N_2=N$.

The first processing path for processing the first set of check nodes ($N_1$) uses a memory bank 1030 (Bank 1) in the edge memory module 905-*a*, an $N_1$ EIC module 1010 in the BNP extrinsic information calculator module 910-*a*, a barrel shifter 912-*a*, a DFC 913-*a*, an $N_1$ CNP module 1015 in the CNP module 915-*a*, a DFC 917-*a*, a barrel shifter 918-*a*, and an $N_1$ accumulator (Acc.) module 1020 in the BNP accumulator module 920-*a*. The operation of the first processing path may be substantially similar to that described above for the LDPC decoder 900 in FIG. 9.

The second processing path for processing the second set of check nodes ($N_2$) uses a memory bank 1040 (Bank 2) in the edge memory module 905-*a*, an $N_2$ EIC module 1012 in the BNP extrinsic information calculator module 910-*a*, a barrel shifter 912-*b*, a DFC 913-*b*, an $N_2$ CNP module 1017 in the CNP module 915-*a*, a DFC 917-*b*, a barrel shifter 918-*b*, and an $N_2$ accumulator (Acc.) module 1022 in the BNP accumulator module 920-*a*. The operation of the second processing path may be substantially similar to that described above for the LDPC decoder 900 in FIG. 9.

The configuration and initialization module 940-*a* may configure the edge memory module 905-*a* to have Bank 1, which is a bank of memory partitions to store extrinsic information for edges corresponding to the first set of check nodes ($N_1$), and Bank 2, which is a bank of memory partitions to store extrinsic information for edges corresponding to the second set of check nodes ($N_2$). The configuration may be based on connectivity information stored in an address LUT 942-*a*. The configuration and initialization module 940-*a* may also initialize channel soft information into the sum memory 925-*a*.

In operation, the edge memory module 905-*a* in the LDPC decoder 1000 is configured to have a first bank and a second bank of memory partitions (Banks 1 and 2). The first bank stores extrinsic information for edges for the first set of check nodes ($N_1$) and the second bank stores extrinsic information for edges for the second set of check nodes ($N_2$). The first and second banks are concurrently accessed through the first processing path and through the second processing path, respectively, to double ($N_1+N_2=2N$) the number of check nodes being processed in parallel by the LDPC decoder 100. In some embodiments, the first and second sets of check nodes may respectively correspond to odd-numbered and even-numbered check nodes from the 2N check nodes processed in parallel. The operation of the LDPC decoder 100 may include initializing channel soft information into the sum memory 925-*a* and the use of incremental changes in the extrinsic information to update the extrinsic information. For example, the outputs provided by the modules in the CNP module 915-*a* (e.g., $N_1$ CNP module 1015, $N_2$ CNP module 1017) may be in the form of incremental changes and not absolute values. These incremental changes are used to generate new sums that are stored as current values in the sum memory 925-*a* and are also stored in the banks of the edge memory module 905-*a*.

While the example illustrated in FIG. 10 shows how to double the processing capability of an LDPC decoder by using the same single edge memory configured to have two banks of memory partitions, other implementations are also possible. For example, by using four processing paths, adding the appropriate components to those paths, and configuring the edge memory to have four banks of memory partitions, it may be possible to process 4N check nodes in parallel.

Figure 11:
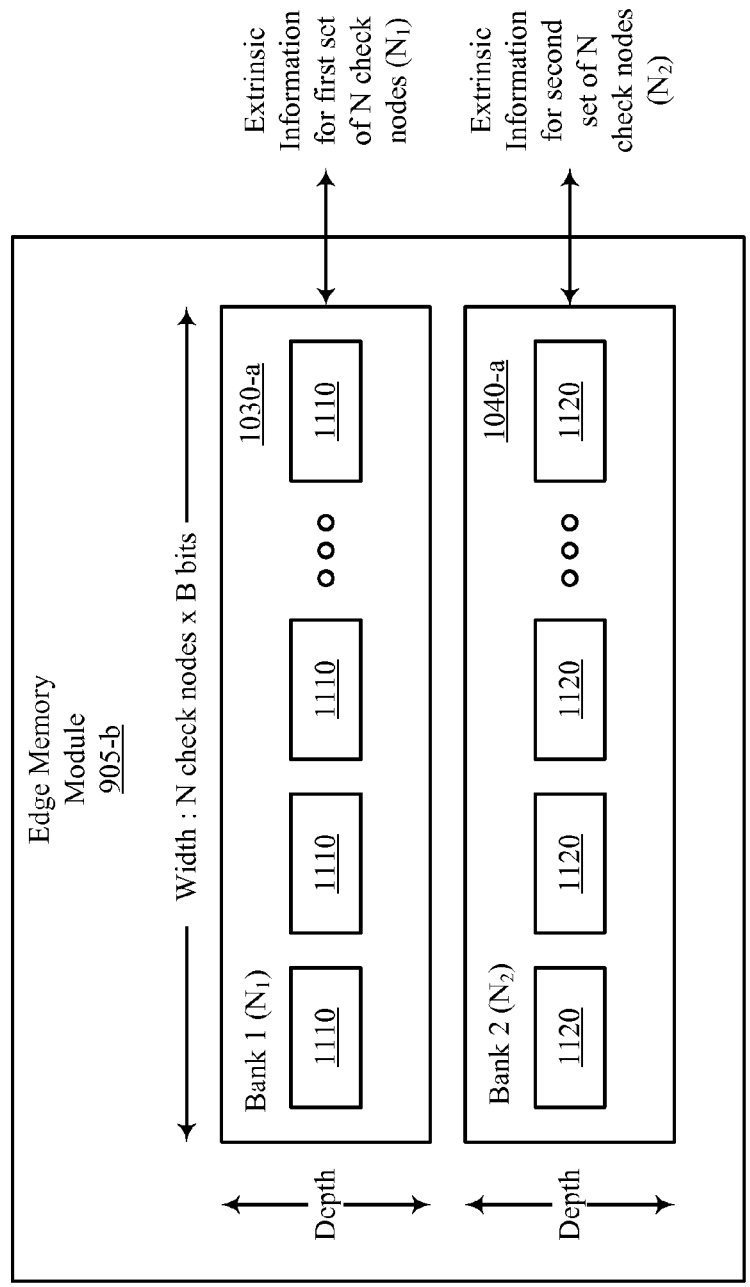
FIG. 11 is a diagram that illustrates an example of an edge memory module architecture according to various embodiments of the principles described herein.

FIG. 11 illustrates an example of an edge memory module 905-*b*, which may be an example of the edge memory modules 905 and 905-*a* of FIG. 9 and FIG. 10. The edge memory module 905-*b* may be implemented using one or more RAM memories in an FPGA or in an ASIC, for example. The edge memory module 905-*b* is configured into a first bank 1030-*a* (Bank 1) that is used to store extrinsic information for edges corresponding to a first set check nodes ($N_1$) and a second bank 1040-*a* that is used to store extrinsic information for edges corresponding to a second set of check nodes ($N_2$), where $N_1=N_2=N$. Bank 1 may include multiple memory partitions 1110 while Bank 2 may include multiple memory partitions 1120. Each of the banks operates independently from the other and may be accessed (e.g., written to/read from) through different ports.

In one example, Bank 1 may be used to store data associated with N odd-numbered check nodes and Bank 2 may be used to store data associated with N even-numbered check nodes. The data in each of the banks may be accessed concurrently for CNP and/or BNP operations. By concurrently accessing extrinsic information for edges corresponding to N check nodes from Bank 1 and extrinsic information for edges corresponding to N check nodes from Bank 2, an LDPC decoder (e.g, LDPC decoders 900, 1000) may perform parallel operations on 2N check nodes. In some embodiments, a component, such as the configuration and initialization modules 940 and 940-*a* of FIG. 9 and FIG. 10, for example, may be used to configure the edge memory module 905-*b* in the same or similar arrangement as described above.

In the case of DVB-S2, for example, in which N check nodes may be processed in parallel, the edge memory may be configured to have a width of 360×6 bits=2160 bits and a depth of 800. When that same edge memory is now configured for processing 2N check nodes in parallel, a first bank of memory partitions (e.g., Bank 1) may have a width of 2160 bits and a depth of 400, while a second bank of memory partitions (e.g., Bank 2) may have a width of 2160 bits and a depth of 400. In other words, by configuring the same amount of memory differently and by storing data in the edge memory in a particular arrangement, it may be possible to implement an LDPC decoder architecture that can double the number of check nodes processed in parallel without having to increase the size of the edge memory.

Figure 12:
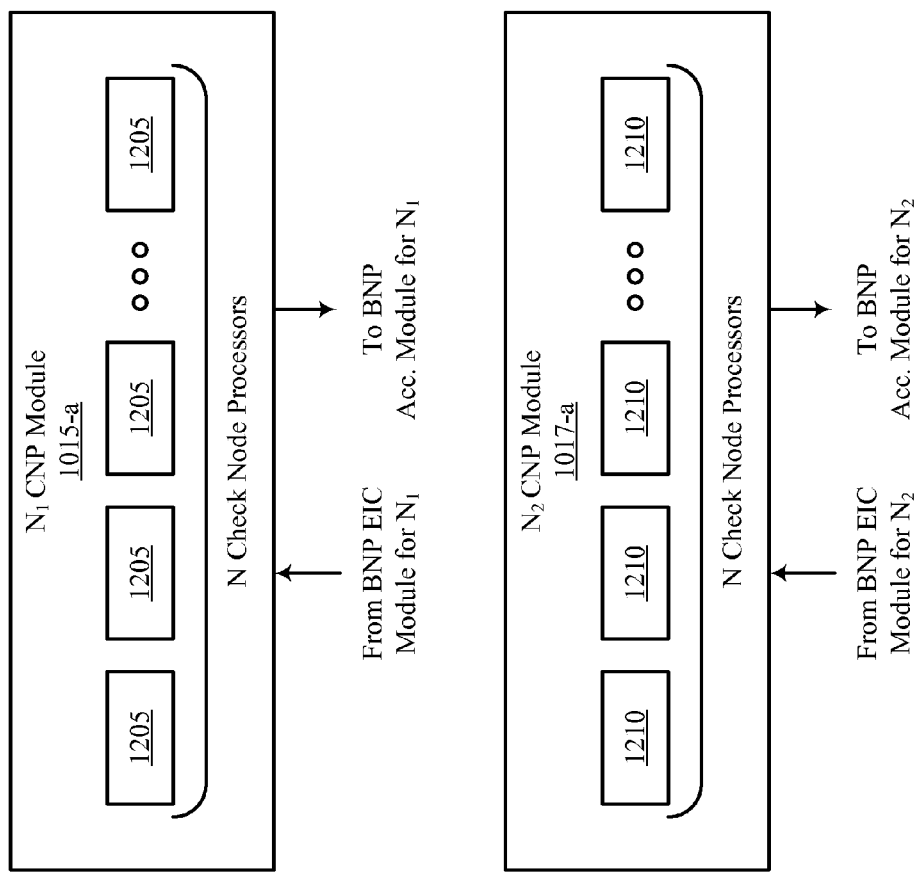
FIG. 12 is a diagram that illustrates example architectures of check node processor (CNP) modules according to various embodiments of the principles described herein.

FIG. 12 illustrates an example of an $N_1$ CNP module 1015-*a*, which may be an example of the CNP module 905 of FIG. 9 and the $N_1$ CNP module 1015 of FIG. 10. The $N_1$ CNP module 1015-*a* may include an array of CNP processors 1205 to perform parallel check node processing. When the edge memory (e.g., edge memory module 905, 905-*a*) is configured with two banks of memory partitions that allow processing of 2N check nodes, the $N_1$ CNP module 1015-*a* may include N CNP processors 1205 in its array of CNP processors. The $N_1$ CNP module 1015-*a* may be used as part of a first processing path in an LDPC decoder and may receive data from, for example, the $N_1$ EIC module 1010 described in FIG. 10, and may send data to, for example, the $N_1$ accumulator module 1020 also described in FIG. 10.

Similarly, FIG. 12 illustrates an example of an $N_2$ CNP module 1017-*a*, which may be an example of the CNP module 905 of FIG. 9 and the $N_2$ CNP module 1017 of FIG. 10. The $N_2$ CNP module 1017-*a* may include an array of CNP processors 1210 to perform parallel check node processing. When the edge memory (e.g., edge memory module 905, 905-*a*) is configured with two banks of memory partitions that allow processing of 2N check nodes, the $N_2$ CNP module 1017-*a* may include N CNP processors 1210 in its array of CNP processors. The $N_2$ CNP module 1017-*a* may be used as part of a second processing path in an LDPC decoder and may receive data from, for example, the $N_2$ EIC module 1012 described in FIG. 10, and may send data to, for example, the $N_2$ accumulator module 1022 also described in FIG. 10.

Figure 13:
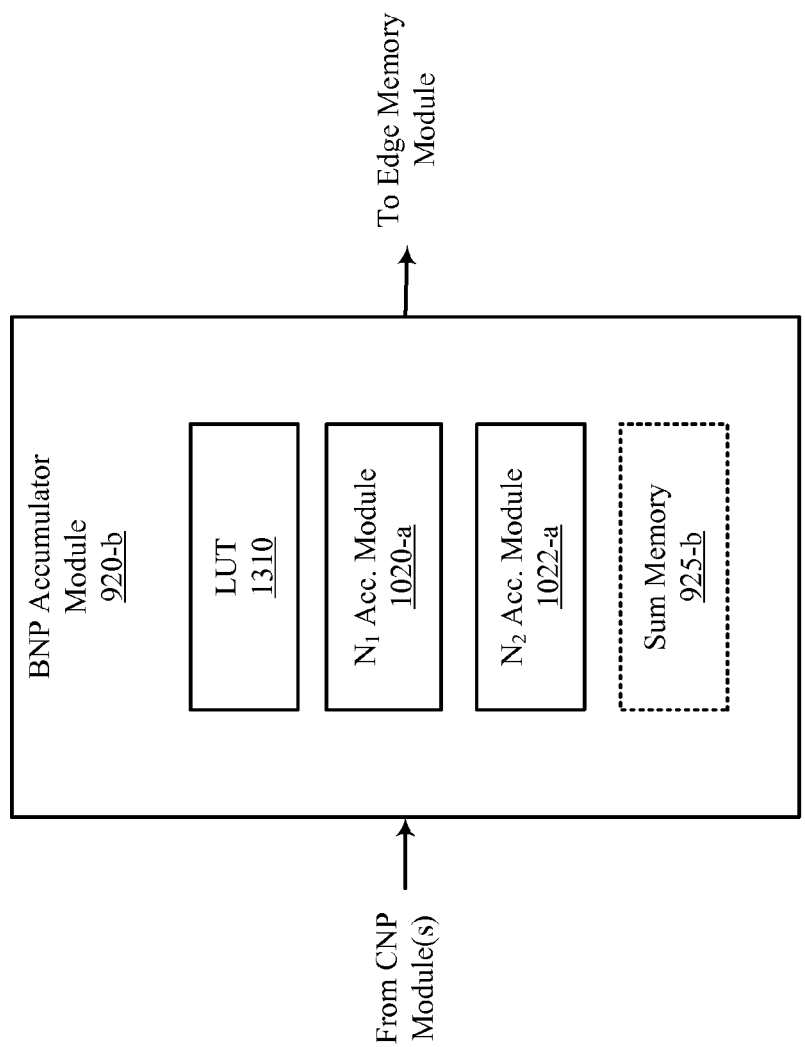
FIG. 13 is a diagram that illustrates an example of a bit node processor (BNP) accumulator module architecture according to various embodiments of the principles described herein.

FIG. 13 illustrates an example of a BNP accumulator module 920-*b*, which may be an example of the BNP accumulator module 920 of FIG. 9 and the BNP accumulator module 920-*a* of FIG. 10. The BNP accumulator module 920-*b* may include an $N_1$ accumulator module 1020-*a*, which may be an example of the $N_1$ accumulator module 1020 of FIG. 10, and an $N_2$ accumulator module 1022-*a*, which may be an example of the $N_2$ accumulator module 1022 of FIG. 10. The BNP accumulator module 920-*b* may, in some embodiments, include a sum memory 925-*b*, which may be an example of the sum memories 925 and 925-*a* of FIG. 9 and FIG. 10. The BNP accumulator module 920-*b* may also include a LUT 1310 that includes information regarding the summations involved in bit node processing, The sum memory 925-*b* may include pre-loaded sums that may be accessed based on the information stored in the LUT 1310.

Another aspect of the operation of an LDPC decoder, such as the LDPC decoders 900 and 1000 of FIG. 9 and FIG. 10, is that the extrinsic information from a previous iteration is typically used for the current iteration and when the current iteration is done the new information generated for the current iteration is then used for the next iteration. This approach, however, may involve having two copies (i.e., memories) of the information from the previous iteration while collecting the information for the current iteration. To reduce the amount of memory used in, for example, the sum memories 925, 925-*a*, and 925-*b* of FIG. 9, FIG. 10, and FIG. 13, only information for a current iteration is kept by immediately updating the information when a change occurs and writing the new value into memory to replace the previous value. This approach may enable the decoding process to be more aggressive and to complete in fewer iterations.

Figure 14:
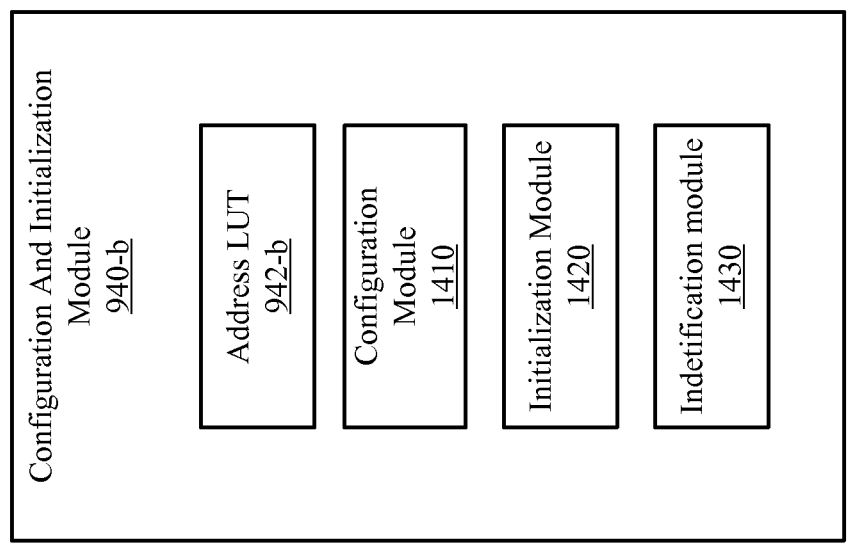
FIG. 14 is a diagram that illustrates an example of a configuration and initialization module architecture according to various embodiments of the principles described herein.

FIG. 14 illustrates an example of a configuration and initialization module 940-*b*, which may be an example of the configuration and initialization modules 940 and 940-*a* of FIG. 9 and FIG. 10. The configuration and initialization module 940-*b* may include an address LUT 942-*b*, which may be an example of the address LUTs 942 and 942-*a* of FIG. 9 and FIG. 10. The configuration and initialization module 940-*b* may also include a configuration module that 1410 that may be configured to configure an edge memory or edge memory module as described herein. The configuration and initialization module 940-*b* may also include an initialization module 1420 that may be configured to initialize one or more components in an LDPC decoder. For example, the initialization module 1420 may initialize soft channel information in a sum memory such as the sum memories 925, 925-*a*, and 925-*b* of FIG. 9, FIG. 10, and FIG. 13. The configuration and initialization module 940-*b* may also include an identification module 1430 that may be configured to identify different sets of check nodes, which are in turn used to configure the operation of an LDPC decoder, including that of an edge memory or edge memory module, to enable the LDPC decoder to process a larger number of check nodes than the code structure supports.

Figure 15:
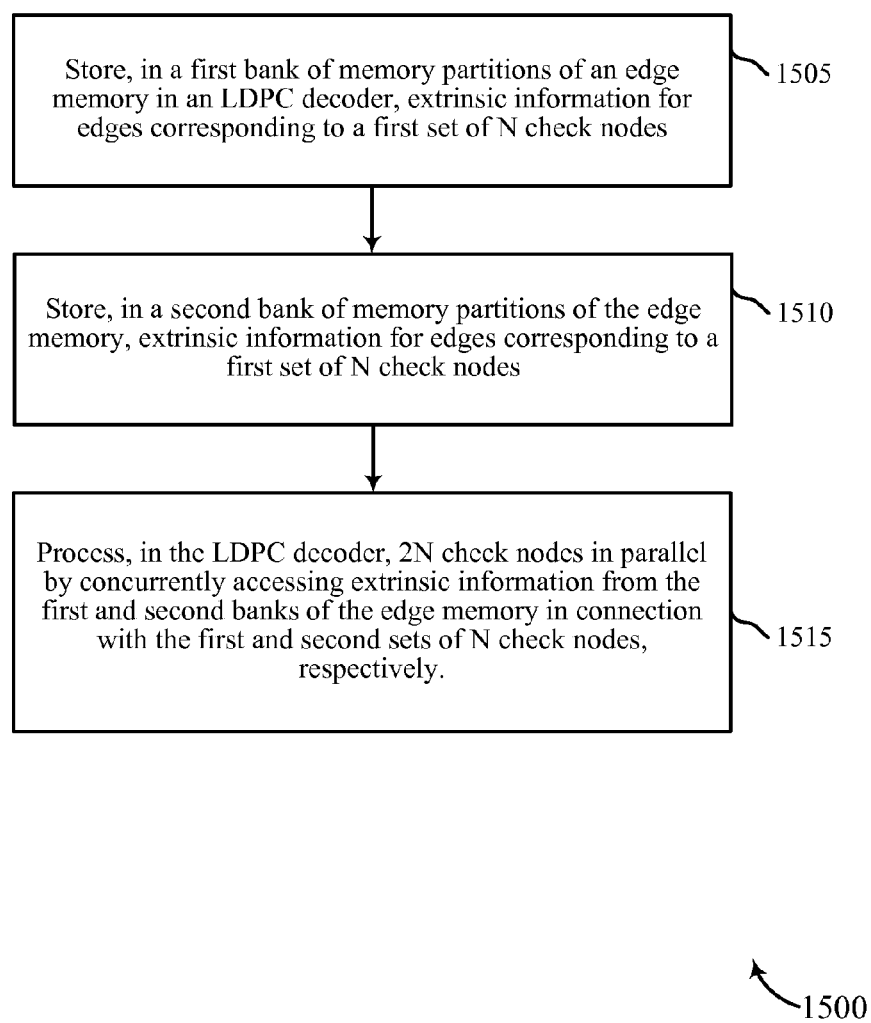
FIG. 15 is a flow chart of an example of a method for decoding data using an LDPC decoder according to various embodiments of the principles described herein.

FIG. 15 illustrates a flowchart diagram of an example method 1500 for decoding data using an LDPC decoder. The method 1500 may be performed using, for example, the digital demodulation and decoding units 125 and 125-*a* of FIG. 1 and FIG. 5, respectively; the decoder modules 515, 515-*a*, and 515-*b* of FIG. 5, FIG. 6, and FIG. 7, respectively; the FEC decoders 650 and 650-*a* FIG. 6 and FIG. 7; the LDPC decoders 900 and 1000 of FIG. 9 and FIG. 10; and/or the modem of FIG. 7.

At block 1505, extrinsic information for edges corresponding to a first set of N check nodes is stored in a first bank of memory partitions (e.g., memory bank 1030) of an edge memory (e.g., edge memory modules 905, 905-*a*, 905-*b*) in an LDPC decoder (e.g., LDPC decoders 900, 1000). At block 1510, extrinsic information for edges corresponding to a second set of N check nodes is stored in a second bank of memory partitions (e.g., memory bank 1040) of the edge memory. At block 1515, the LDPC decoder may process 2N check nodes in parallel by concurrently accessing extrinsic information from the first and second banks of the edge memory in connection with the first and second sets of N check nodes, respectively. In some embodiments, the first set of N check nodes may correspond to odd-numbered check nodes of the 2N check nodes processed by the LDPC decoder, while the second set of N check nodes may correspond to even-numbered check nodes of the 2N check nodes processed by the LDPC decoder.

In some embodiments of the method 1500, the first and second sets of N check nodes may be determined based at least in part on connectivity information stored in an address lookup table (e.g., address LUT 942). In some embodiments, a memory (e.g., sum memory 925) in the LDPC decoder different from the edge memory may be initialized with channel soft information. Based at least in part on the channel soft information, extrinsic information for edges corresponding to the first and second sets of N check nodes may be generated during a first decoding iteration performed by the LDPC decoder. In some embodiments, incremental changes in the extrinsic information for edges corresponding to the first and second sets of N check nodes may be determined during subsequent decoding iterations performed by the LDPC decoder. The edge memory may store the incremental changes.

In some embodiments of the method 1500, extrinsic information for edges corresponding to a third set of N check nodes may be stored in a third bank of memory partitions (e.g., memory bank 1030) of the edge memory. Extrinsic information for edges corresponding to a fourth set of N check nodes may be stored in a fourth bank of memory partitions (e.g., memory bank 1040) of the edge memory. The LDPC decoder may process 4N check nodes in parallel by concurrently accessing extrinsic information from the first, second, third, and fourth banks of the edge memory in connection with the first, second, third, and fourth sets of N check nodes, respectively. In some embodiments, the processing the 2N check nodes in parallel by concurrently accessing extrinsic information from the first and second banks of the edge memory may include reading extrinsic information from or writing extrinsic information to the first bank of the edge memory while, without conflicts, reading extrinsic information from or writing extrinsic information to the second bank of the edge memory.

In some embodiments, an edge memory (e.g., edge memory modules 905, 905-a, 905-b) in an LDPC decoder is configured to have a first bank of memory partitions to store extrinsic information for edges corresponding to a first set of N check nodes and a second bank of memory partitions to store extrinsic information for edges corresponding to a second set of N check nodes, where the first and second banks of the edge memory are independent from each other. The LDPC decoder (e.g., LDPC decoders 900, 1000) is based on a code structure that supports N check nodes in parallel. The LDPC decoder may process 2N check nodes in parallel by concurrently accessing extrinsic information from the first and second banks of the edge memory in connection with the first and second sets of N check nodes, respectively. The first set of N check nodes may correspond to odd-numbered check nodes of the 2N check nodes processed in the LDPC decoder and the second set of N check nodes may correspond to even-numbered check nodes of the 2N check nodes processed in the LDPC decoder. In some embodiments, the first and second sets of N check nodes may be identified or determined based at least in part on information stored in a memory (e.g., address LUT 942) in the LDPC decoder different from the edge memory.

Figure 16:
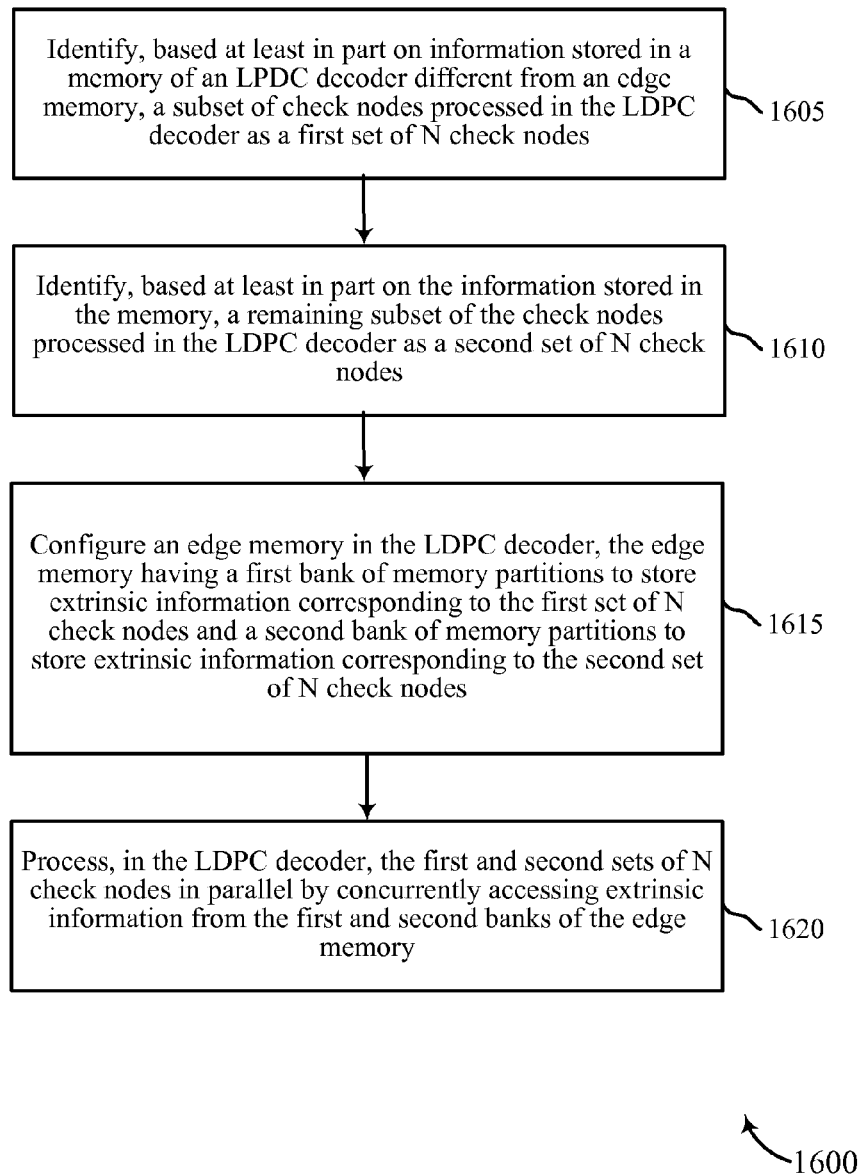
FIG. 16 is a flow chart of another example of a method for decoding data using an LDPC decoder according to various embodiments of the principles described herein.

FIG. 16 illustrates a flowchart diagram of an example method 1600 for decoding data using an LDPC decoder. The method 1600, like the method 1500 above, may be performed using, for example, the digital demodulation and decoding units 125 and 125-a of FIG. 1 and FIG. 5, respectively; the decoder modules 515, 515-a, and 515-b of FIG. 5, FIG. 6, and FIG. 7, respectively; the FEC decoders 650 and 650-a FIG. 6 and FIG. 7; the LDPC decoders 900 and 1000 of FIG. 9 and FIG. 10; and/or the modem of FIG. 7.

At block 1605, a subset of check nodes processed by an LDPC decoder (e.g., LDPC decoders 900, 1000) may be identified as a first set of N check nodes based at least in part on information stored in a memory (e.g., address LUT 942) of the LDPC decoder different from an edge memory (e.g., edge memory modules 905, 905-a, 905-b). At block 1610, a remaining subset of the check nodes processed by the LDPC decoder may be identified as a second set of N check nodes based at least in part on the information stored in the memory. At block 1615, the edge memory in the LDPC decoder may be configured to have a first bank of memory partitions (e.g., memory bank 1030, Bank 1) to store extrinsic information corresponding to the first set of N check nodes and a second bank of memory partitions (e.g., memory bank 1040, Bank 2) to store extrinsic information corresponding to the second set of N check nodes. At block 1620, the first and second sets of N check nodes are processed in the LDPC decoder in parallel by concurrently accessing extrinsic information from the first and second banks of the edge memory.

Figure 17:
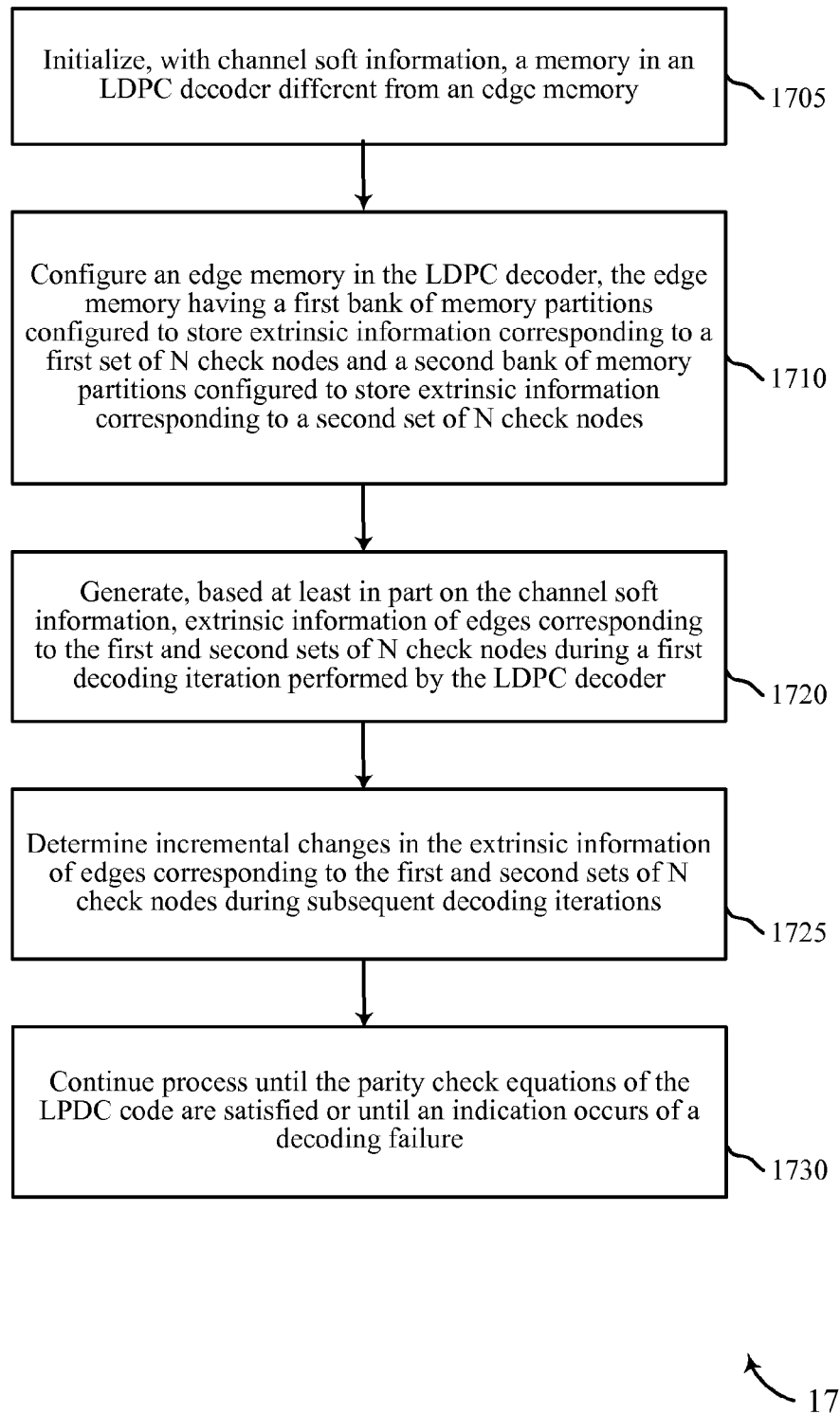
FIG. 17 is a flow chart of yet another example of a method for decoding data using an LDPC decoder according to various embodiments of the principles described herein.

FIG. 17 illustrates a flowchart diagram of an example method 1700 for decoding data using an LDPC decoder. The method 1700, like the methods 1500 and 1600 above, may be performed using, for example, the digital demodulation and decoding units 125 and 125-a of FIG. 1 and FIG. 5, respectively; the decoder modules 515, 515-a, and 515-b of FIG. 5, FIG. 6, and FIG. 7, respectively; the FEC decoders 650 and 650-a FIG. 6 and FIG. 7; the LDPC decoders 900 and 1000 of FIG. 9 and FIG. 10; and/or the modem of FIG. 7.

At block 1705, a memory (e.g., sum memory 925) in an LDPC decoder (e.g., LDPC decoders 900, 1000) different from an edge memory (e.g., edge memory modules 905, 905-a, 905-b) may be initialized with channel soft information. At block 1710, the edge memory in the LDPC decoder may be configured to have a first bank of memory partitions (e.g., memory bank 1030, Bank 1) to store extrinsic information corresponding to the first set of N check nodes and a second bank of memory partitions (e.g., memory bank 1040, Bank 2) to store extrinsic information corresponding to the second set of N check nodes. At block 1720, based at least in part on the channel soft information, extrinsic information for edges corresponding to the first and second sets of N check nodes may be generated during a first decoding iteration performed by the LDPC decoder. At block 1725, incremental changes in the extrinsic information for edges corresponding to the first and second sets of N check nodes may be determined during subsequent decoding iterations. At block 1730, the process is continued until the parity check equations of the LDPC code are satisfied or until an indication occurs of a decoding failure. The indication may correspond to reaching a set number of iterations without a valid decoding.

In some embodiments, a system for decoding data includes means for storing in a first bank of memory partitions of an edge memory in an LDPC decoder, extrinsic information for edges corresponding to a first set of N check nodes. The means may include, but need not be limited to, a memory bank in an edge memory as illustrated in FIG. 10, and/or FIG. 11, for example. The system also includes means for storing in a second bank of memory partitions of the edge memory, extrinsic information for edges corresponding to a second set of N check nodes. The means may include, but need not be limited to, a memory bank in an edge memory as illustrated in FIG. 10, and/or FIG. 11, for example. The system also includes means for processing, in the LDPC decoder, 2N check nodes in parallel by concurrently accessing extrinsic information from the first and second banks of the edge memory in connection with the first and second sets of N check nodes, respectively. The means may include, but need not be limited to, one or more CNP modules as illustrated in FIG. 9, FIG. 10, and/or FIG. 12, for example. The means for processing the 2N check nodes in parallel by concurrently accessing extrinsic information from the first and second banks of the edge memory may include means for reading extrinsic information from or writing extrinsic information to the first bank of the edge memory while, without conflicts, reading extrinsic information from or writing extrinsic information to the second bank of the edge memory. The means may include, but need not be limited to, one or more CNP modules, one or more BNP extrinsic information calculator modules, and/or one or more BNP accumulator modules as illustrated in FIG. 9, FIG. 10, FIG. 12, and/or FIG. 13, for example.

The system may also include means for determining the first and second sets of N check nodes. The means may include, but need not be limited to, a configuration and initialization module as illustrated in FIG. 9, FIG. 10, and/or FIG. 14, for example. The system may also include means for initializing, with channel soft information, a memory in the LDPC decoder different from the edge memory. The means may include, but need not be limited to, a configuration and initialization module as illustrated in FIG. 9, FIG. 10, and/or FIG. 14, for example. The system may also include means for generating, based at least in part on the channel soft information, the extrinsic information for edges corresponding to the first and second sets of N check nodes during a first decoding iteration performed by the LDPC decoder. The means may include, but need not be limited to, one or more CNP modules, one or more BNP extrinsic information calculator modules, and/or one or more BNP accumulator modules as illustrated in FIG. 9, FIG. 10, FIG. 12, and/or FIG. 13, for example.

The system may also include means for storing in a third bank of memory partitions of the edge memory, extrinsic information for edges corresponding to a third set of N check nodes. The means may include, but need not be limited to, a memory bank in an edge memory as illustrated in FIG. 10, and/or FIG. 11, for example. The system may also include means for storing in a fourth bank of memory partitions of the edge memory, extrinsic information for edges corresponding to a fourth set of N check nodes. The means may include, but need not be limited to, a memory bank in an edge memory as illustrated in FIG. 10, and/or FIG. 11, for example. The system may also include means for processing, in the LDPC decoder, 4N check nodes in parallel by concurrently accessing extrinsic information from the first, second, third, and fourth banks of the edge memory in connection with the first, second, third, and fourth sets of N check nodes, respectively. The means may include, but need not be limited to, one or more CNP modules as illustrated in FIG. 9, FIG. 10, and/or FIG. 12, for example.

While the various embodiments and examples described above have been illustrated with reference to optical communication systems that use fiber optic cables as a data transmission medium or path, those embodiments and examples may also be applicable to systems in which communications occur through other types of transmission media or paths. For example, some or all of the embodiments and examples describe above may be applicable to communications through free space or similar media in which electromagnetic signals are radiated, such as cellular communications, point-to-point communications, and satellite communications, to name a few.

As will be readily understood, the components and modules described with reference to various embodiments above may, individually or collectively, be implemented with one or more Application Specific Integrated Circuits (ASICs) adapted to perform some or all of the applicable functions in hardware. Alternatively, the functions may be performed by one or more other processing units (or cores), on one or more integrated circuits. In other embodiments, other types of integrated circuits may be used (e.g., Structured/Platform ASICs, Field Programmable Gate Arrays (FPGAs) and other Semi-Custom ICs), which may be programmed in any manner known in the art. The functions of each unit may also be implemented, in whole or in part, with instructions embodied in a memory, formatted to be executed by one or more general or application-specific processors.

It should be noted that the methods, systems and devices discussed above are intended merely to be examples. It must be stressed that various embodiments may omit, substitute, or add various procedures or components as appropriate. For instance, it should be appreciated that, in alternative embodiments, the methods may be performed in an order different from that described, and that various steps may be added, omitted or combined. Also, features described with respect to certain embodiments may be combined in various other embodiments. Different aspects and elements of the embodiments may be combined in a similar manner. Also, it should be emphasized that technology evolves and, thus, many of the elements are exemplary in nature and should not be interpreted to limit the scope of embodiments of the principles described herein.

Specific details are given in the description to provide a thorough understanding of the embodiments. However, it will be understood by one of ordinary skill in the art that the embodiments may be practiced without these specific details. For example, well-known circuits, processes, algorithms, structures, and techniques have been shown without unnecessary detail in order to avoid obscuring the embodiments.

Also, it is noted that the embodiments may be described as a process which is depicted as a flow diagram or block diagram. Although each may describe the operations as a sequential process, many of the operations can be performed in parallel or concurrently. In addition, the order of the operations may be rearranged. A process may have additional steps not included in the figure.

Furthermore, embodiments may be implemented by hardware, software, firmware, middleware, microcode, hardware description languages, or any combination thereof. When implemented in software, firmware, middleware or microcode, the program code or code segments to perform the necessary tasks may be stored in a computer-readable medium such as a storage medium. Processors may perform the necessary tasks.

Having described several embodiments, it will be recognized by those of skill in the art that various modifications, alternative constructions, and equivalents may be used without departing from the spirit of the principles described herein. For example, the above elements may merely be a component of a larger system, wherein other rules may take precedence over or otherwise modify the application of the principles described herein. Also, a number of steps may be undertaken before, during, or after the above elements are considered. Accordingly, the above description should not be taken as limiting the scope of the invention.

What is claimed is:

1. A device for decoding data using a low-density parity check (LDPC) decoder, the LDPC decoder utilizing a code structure that supports 2N check nodes processed in parallel, the device comprising:
an edge memory configured to have a first bank of memory partitions to store extrinsic information for edges corresponding to a first set of N check nodes, the first set of N check nodes corresponding to odd-numbered check nodes of the 2N check nodes, and to have a second bank of memory partitions to store extrinsic information for edges corresponding to a second set of N check nodes, the second set of N check nodes corresponding to even-numbered check nodes of the 2N check nodes, the first and second banks of the edge memory being independent from each other;
a first processing module configured to process the first set of N check nodes; and
a second processing module configured to process the second set of N check nodes, the first and second sets of N check nodes being processed in parallel by concurrently accessing extrinsic information from the first and second banks of the edge memory in connection with the first and second sets of N check nodes, respectively.

2. The device of claim 1, wherein:
the first processing module comprises a first check node processing (CNP) module configured to process extrinsic information for edges corresponding to the first set of N check nodes, and
the second processing module comprises a second CNP module configured to process extrinsic information for edges corresponding to the second set of N check nodes.

3. The device of claim 1, further comprising:
a first bit node processing (BNP) accumulator module configured to process incremental changes in the extrinsic information for edges corresponding to the first set of N check nodes; and
a second BNP accumulator module configured to process incremental changes in the extrinsic information for edges corresponding to the second set of N check nodes.

4. The device of claim 1, further comprising:
a first BNP calculator module configured to generate updated extrinsic information for edges corresponding to the first set of N check nodes; and
a second BNP calculator module configured to generate updated extrinsic information for edges corresponding to the second set of N check nodes.

5. The device of claim 1, wherein each of the first and second processing modules comprises:
a CNP module configured to process in parallel extrinsic information for edges corresponding to N check nodes.

6. The device of claim 1, further comprising:
a configuration module configured to determine the first and second sets of N check nodes based at least in part on connectivity information stored in an address lookup table.

7. The device of claim 1, further comprising:
a memory different from the edge memory, the memory being initialized with channel soft information, the first and second processing modules being configured to generate, based at least in part on the channel soft information, the extrinsic information for edges corresponding to the first and second sets of N check nodes during a first decoding iteration performed by the LDPC decoder.

8. The device of claim 7, wherein:
the first and second processing modules are configured to determine incremental changes in the extrinsic information for edges corresponding to the first and second sets of N check nodes during subsequent decoding iterations performed by the LDPC decoder, and
the edge memory is configured to store the incremental changes.

9. The device of claim 1, further comprising:
a third processing module configured to process a third set of N check nodes, the edge memory being configured to have a third bank of memory partitions to store extrinsic information for edges corresponding the third set of N check nodes; and
a fourth processing module configured to process a fourth set of N check nodes, the edge memory being configured to have a fourth bank of memory partitions to store extrinsic information for edges corresponding to the fourth set of N check nodes, the first, second, third, and fourth banks of the edge memory being independent from each other, and the first, second, third, and fourth sets of N check nodes being processed in parallel by concurrently accessing extrinsic information from the first, second, third, and fourth banks of the edge memory in connection with the first, second, third, and fourth sets of N check nodes, respectively.

10. The device of claim 1, wherein the first and second processing modules are configured to read extrinsic information from or write extrinsic information to the first bank of the edge memory while, without conflicts, read extrinsic information from or write extrinsic information to the second bank of the edge memory.

11. A method for decoding data using an edge memory in a low-density parity check (LDPC) decoder, the LDPC decoder utilizing a code structure that supports 2N check nodes processed in parallel, the method comprising:
storing, in a first bank of memory partitions of the edge memory, extrinsic information for edges corresponding to a first set of N check nodes, the first set of N check nodes corresponding to odd-numbered check nodes of the 2N check nodes;
storing, in a second bank of memory partitions of the edge memory, extrinsic information for edges corresponding to a second set of N check nodes, the second set of N check nodes corresponding to even-numbered check nodes of the 2N check nodes, the first and second banks of the edge memory being independent from each other; and
processing, in the LDPC decoder, the 2N check nodes in parallel by concurrently accessing extrinsic information from the first and second banks of the edge memory in connection with the first and second sets of N check nodes, respectively.

12. The method of claim 11, further comprising:
determining the first and second sets of N check nodes based at least in part on connectivity information stored in an address lookup table.

13. The method of claim 11, further comprising:
initializing, with channel soft information, a memory in the LDPC decoder different from the edge memory; and
generating, based at least in part on the channel soft information, extrinsic information for edges corresponding to the first and second sets of N check nodes during a first decoding iteration performed by the LDPC decoder.

14. The method of claim 13, further comprising:
determining incremental changes in the extrinsic information for edges corresponding to the first and second sets of N check nodes during subsequent decoding iterations performed by the LDPC decoder; and
storing in the edge memory the incremental changes.

15. The method of claim 11, further comprising:
- storing, in a third bank of memory partitions of the edge memory, extrinsic information for edges corresponding to a third set of N check nodes;
- storing, in a fourth bank of memory partitions of the edge memory, extrinsic information for edges corresponding to a fourth set of N check nodes, the first and second banks of the edge memory being independent from each other; and
- processing, in the LDPC decoder, 4N check nodes in parallel by concurrently accessing extrinsic information from the first, second, third, and fourth banks of the edge memory in connection with the first, second, third, and fourth sets of N check nodes, respectively.

16. The method of claim 11, wherein processing the 2N check nodes in parallel by concurrently accessing extrinsic information from the first and second banks of the edge memory comprises:
- reading extrinsic information from or writing extrinsic information to the first bank of the edge memory while, without conflicts, reading extrinsic information from or writing extrinsic information to the second bank of the edge memory.

* * * * *